United States Patent
Sakamoto

(10) Patent No.: US 8,498,855 B2
(45) Date of Patent: Jul. 30, 2013

(54) CIRCUIT SIMULATION BASED ON GATE SPACING FROM ADJACENT MOS TRANSISTORS

(75) Inventor: Hideo Sakamoto, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 469 days.

(21) Appl. No.: 12/585,850

(22) Filed: Sep. 25, 2009

(65) Prior Publication Data

US 2010/0082308 A1     Apr. 1, 2010

(30) Foreign Application Priority Data

Sep. 26, 2008 (JP) .................................. 2008-247920

(51) Int. Cl.
*G06F 17/50* (2006.01)
*G06F 9/455* (2006.01)

(52) U.S. Cl.
USPC .............................. 703/14; 716/106; 716/111

(58) Field of Classification Search
USPC ........................ 703/13, 14; 716/106, 111, 136
See application file for complete search history.

(56) References Cited

U.S. PATENT DOCUMENTS

| | | | |
|---|---|---|---|
| 6,091,125 A * | 7/2000 | Zavracky | 257/417 |
| 7,711,526 B2 * | 5/2010 | Maeda et al. | 703/2 |
| 7,934,178 B2 | 4/2011 | Arimoto | |
| 2005/0117419 A1 * | 6/2005 | Hoshino et al. | 365/202 |
| 2006/0190854 A1 * | 8/2006 | Watt | 716/4 |
| 2007/0029584 A1 * | 2/2007 | Valenzuela et al. | 257/254 |
| 2008/0109767 A1 | 5/2008 | Arimoto | |

FOREIGN PATENT DOCUMENTS

| | | |
|---|---|---|
| JP | 11-284170 | 1/1999 |
| JP | 2004-031909 A | 1/2004 |
| JP | 2008-117210 A | 5/2008 |

* cited by examiner

*Primary Examiner* — David Silver
*Assistant Examiner* — Andre Pierre Louis
(74) *Attorney, Agent, or Firm* — Foley & Lardner LLP

(57) ABSTRACT

A circuit simulation apparatus is provided with a parameter calculating tool and a circuit simulator. The parameter calculating tool is configured to extract gate spacings between gates of a target MOS transistor and adjacent MOS transistors integrated in an integrated circuit from layout data of the integrated circuit, and to calculate a transistor model parameter corresponding to a threshold voltage of the target MOS transistor based on the extracted gate spacings. The circuit simulator is configured to perform circuit simulation of the integrated circuit by using the calculated transistor model parameter.

20 Claims, 21 Drawing Sheets

Fig. 3
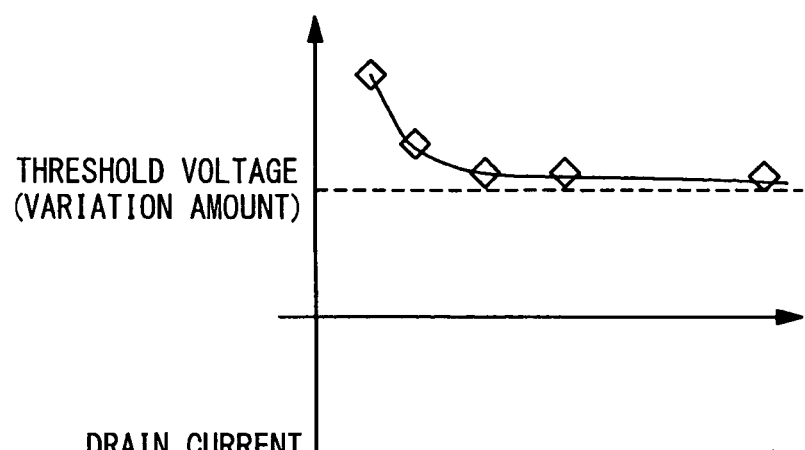
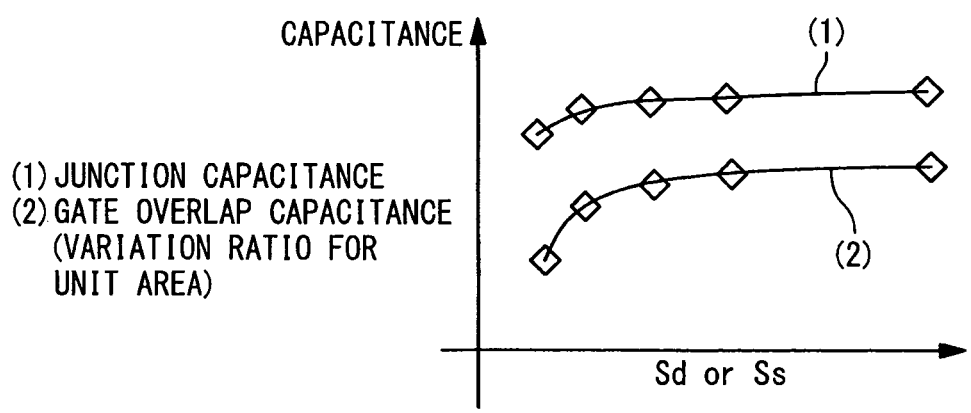
(1) JUNCTION CAPACITANCE
(2) GATE OVERLAP CAPACITANCE
(VARIATION RATIO FOR UNIT AREA)

Fig. 8
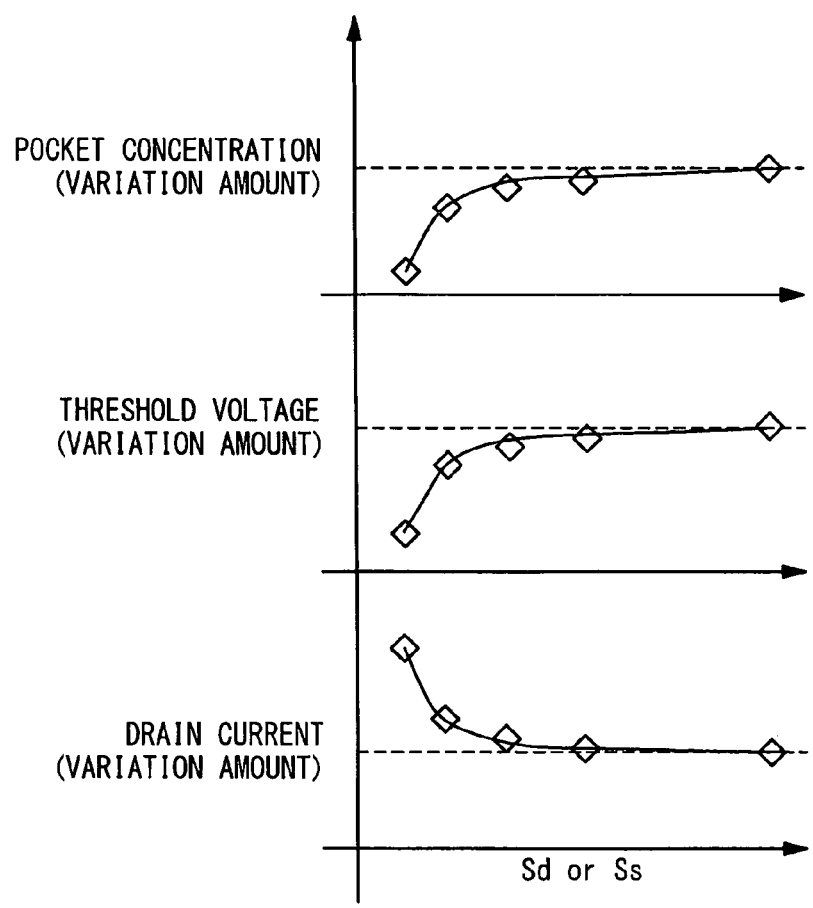
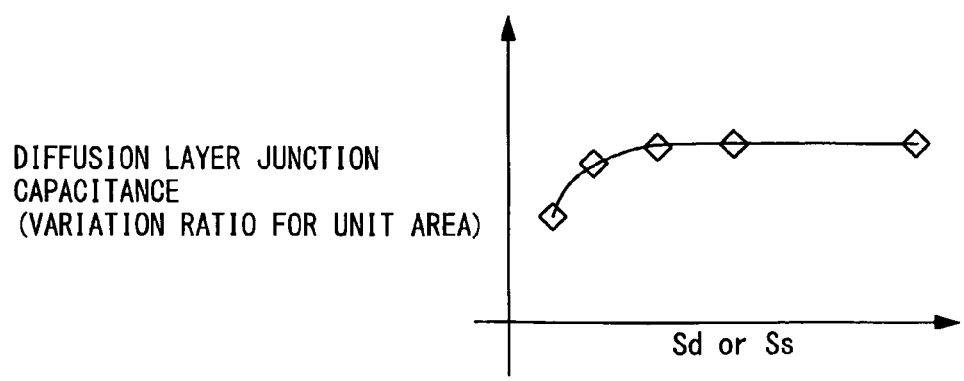

CIRCUIT SIMULATION BASED ON GATE SPACING FROM ADJACENT MOS TRANSISTORS

INCORPORATION BY REFERENCE

This application claims the benefit of priority based on Japanese Patent Application No. 2008-247920, filed on Sep. 26, 2008, the disclosure of which is incorporated herein by reference.

BACKGROUND OF THE INVENTION

1. Field of the Invention

The present invention relates to a circuit simulation apparatus and a circuit simulation method, in particular, a technique for performing circuit simulation in consideration of variations in transistor characteristics depending on the shape of the peripheral pattern of the target transistor.

2. Description of the Related Art

One prominent property of high-integration LSI transistors is that the transistor characteristics thereof vary depending on the peripheral pattern shape. The magnitude of applied stress, the implantation dose of impurities and actual finished dimensions of a particular transistor are influenced by the peripheral pattern shape of the particular transistor. Such pattern dependency of the transistor characteristics is enhanced with the miniaturization of the pattern, thereby possibly causing a circuit malfunction and lowering the fabrication yield.

The problem that the pattern dependency severely affects the transistor characteristics may be solved by adopting any of the two approaches described below in the design phase. A first approach is to perform a timing design by setting margins for the manufacturing variations as well as margins for the variations in transistor characteristics depending on the pattern shape. A second approach is to perform layout design so that designed pattern dimensions are not in the region in which the transistor characteristics largely vary. These two approaches, however, suffers from a problem of an excessive margin in the design phase, resulting in deterioration of timing convergence in the circuit design and increase in design TAT (Turn Around Time). In addition, these two approaches may lead to overestimation of the chip size. In other words, the above-mentioned general approaches inevitably sacrifice at least one of the design TAT and the chip size (in turn, the cost) in order to assure the design quality and to prevent the risk of lowering the yield. This is undesirable in terms of competitiveness of product LSIs.

To solve the problem of the pattern dependency of the transistor characteristics, it is effective to grasp the pattern dependency of the transistor characteristics in detail, to estimate the transistor characteristics with high accuracy, and to perform circuit design and circuit simulation based on the estimated transistor characteristics. If the transistor characteristics can be estimated with high accuracy, this eliminates the need for setting of excessive margins and thereby reducing the design TAT with improved timing convergence. The accurate estimation of the transistor characteristics allows designing the pattern dimensions in a region in which the transistor characteristics largely vary, reducing the chip size due to the improved flexibility in selecting pattern dimensions.

One parameter on which the inventor has focused to estimate the pattern dependency of the transistor characteristics with high accuracy is the dependency of the transistor characteristics on the gate spacing. The characteristics of a particular transistor depend on the gate spacing between adjacent transistors (that is, the distance between the gate of a particular transistor and the gate of the neighboring transistor). It is important to consider such dependency of the transistor characteristics on the gate spacing between adjacent transistors for accurately estimating the transistor characteristics.

The fact that the gate spacing between adjacent transistors affects the transistor characteristics is publicly known in Japanese Laid-Open Patent Application No. JP-A Heisei 11-284170. This application discloses that the effective gate length Leff of a particular transistor depends on the gate spacing defined in the design layout due to the proximity effect, and this influences the drain current of the particular transistor.

According to the inventors' consideration, however, there are various effects caused by the gate spacing between adjacent transistors on the transistor characteristics other than the variations in the effective gate length Leff, and thus the technique method disclosed in Japanese Laid-Open Patent Application No. JP-A Heisei 11-284170 is insufficient to perform accurate circuit simulation.

SUMMARY OF THE INVENTION

The inventor has discovered that the threshold voltage of a MOS transistor depends on gate spacings from adjacent transistors through various phenomena, and therefore it is of significance to consider the gate spacing dependence of the threshold voltage of a MOS transistor for accurately estimating the transistor characteristics thereof. First, the gate spacing from the adjacent transistor influences the impurity profile in the source and drain, and therefore influences the threshold voltage of the MOS transistor. Second, the gate spacing from the adjacent transistor influences the actual width of the side wall, and therefore influences the threshold voltage of the MOS transistor. Third, a narrow gate spacing from the adjacent transistor may cause the threshold voltage of the MOS transistor, since impurities may not be implanted in the pocket implantation. Finally, the actual gate dimensions of the MOS transistor depend on the gate spacing from the adjacent transistor due to the influences of the optical proximity effect and optical proximity correction, and this influences the threshold voltage of the MOS transistor. As thus described, the gate spacing from the adjacent transistor may cause influences on the threshold voltage of the MOS transistor through the above-described four phenomena. Therefore, it is effective for improving the accuracy of circuit simulation to perform the circuit simulation in consideration of the influences of the gate spacing from the adjacent transistor on the threshold voltage of the target transistor.

In an aspect of the present invention, a circuit simulation apparatus is provided with a parameter calculating tool and a circuit simulator. The parameter calculating tool is configured to extract gate spacings between gates of a target MOS transistor and adjacent MOS transistors integrated in an integrated circuit from layout data of the integrated circuit, and to calculate a transistor model parameter corresponding to a threshold voltage of the target MOS transistor based on the extracted gate spacings. The circuit simulator is configured to perform circuit simulation of the integrated circuit by using the calculated transistor model parameter.

In another aspect of the present invention, a circuit simulation method is provided with:

extracting gate spacings between gates of a target MOS transistor and adjacent MOS transistors integrated in an integrated circuit from layout data of the integrated circuit;

calculating a transistor model parameter corresponding to a threshold voltage of the target MOS transistor based on the extracted gate spacings; and performing circuit simulation of the integrated circuit by using the calculated transistor model parameter.

In still another aspect of the present invention, a recording medium records a program which when executed causes a computer to perform a circuit simulation method, the method comprising: extracting gate spacings between gates of a target MOS transistor and adjacent MOS transistors integrated in an integrated circuit from layout data of the integrated circuit; calculating a transistor model parameter corresponding to a threshold voltage of the target MOS transistor based on the extracted gate spacings; and performing circuit simulation of the integrated circuit by using the calculated transistor model parameter.

The present invention allows accurately estimating the effect of the gate spacing between adjacent transistors on the transistor characteristics and thereby improving the accuracy of circuit simulation.

BRIEF DESCRIPTION OF THE DRAWINGS

The above and other objects, advantages and features of the present invention will be more apparent from the following description of certain preferred embodiments taken in conjunction with the accompanying drawings, in which:

FIG. 3 is a graph showing variations of the threshold voltage, the drain current, the diffusion layer junction capacitance and the gate overlap capacitance due to the gate spacing dependency of the impurity profile in the source/drain region;

FIG. 8 is a graph showing variations in the threshold voltage, the drain current and the diffusion layer junction capacitance due to the gate spacing dependency of the shadowing in the pocket implantation;

DESCRIPTION OF PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes.

1. Concept of Circuit Simulation Technique

Figure 1:
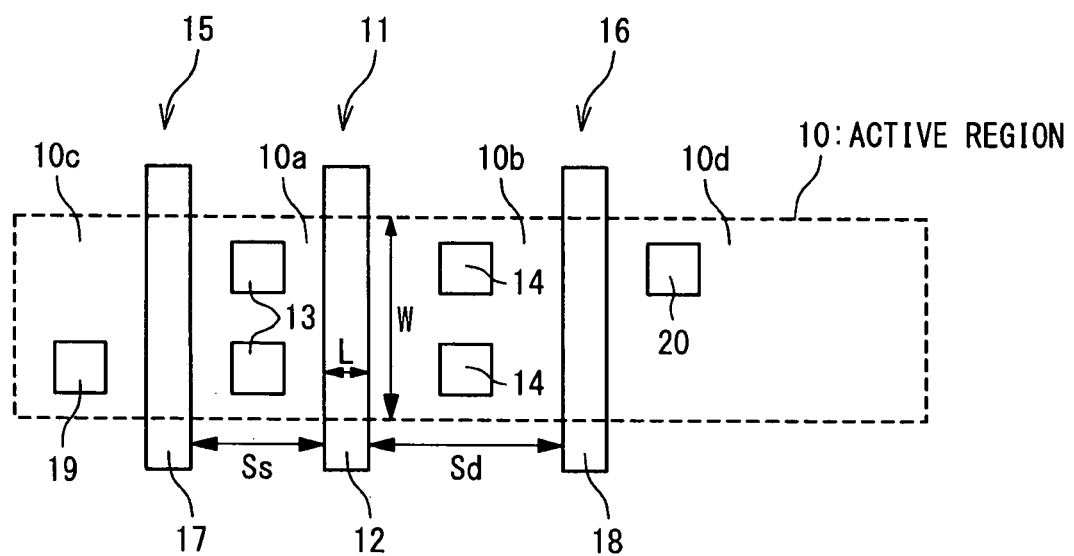
FIG. 1 is a diagram showing an example of the layout of an integrated circuit to be simulated.

First, a description is given of the concept of a circuit simulation technique in one embodiment of the present invention, referring to FIG. 1.

FIG. 1 is a diagram showing an example of the layout of an integrated circuit to be simulated. In FIG. 1, the reference numeral 10 denotes an active region and the reference numeral 11 denotes a MOS transistor to be simulated (hereinafter referred to as the "target transistor"). The reference numeral 12 denotes the gate of the MOS transistor 11. The gate 12 is provided so as to cross the active region 10. The region located immediately below the gate 12 in the active region 10 acts as the channel region of the MOS transistor 11. Via contacts 13 are provided in a portion 10a of the active region 10 used as the source of the MOS transistor 11, and via contacts 14 are provided in a portion 10b of the active region 10 used as the drain of the MOS transistor 11.

MOS transistors 15, 16 are provided next to the MOS transistor 11. Both of the gates 17 and 18 of the MOS transistors 15 and 16 are provided so as to cross the active region 10. A via contact 19 is provided in a portion 10c of the active region 10 used as the drain of the MOS transistor 15, and a via contact 20 is provided in a region 10d of the active region 10 used as the source of the MOS transistor 16.

In this embodiment, circuit simulation is performed noting the phenomenon that the spacings between the gate 12 of the target MOS transistor 11 and the gates 17 and 18 of the adjacent MOS transistors 15 and 16 (hereinafter referred to as "gate spacing") affect the transistor characteristics of the target MOS transistor 11. In FIG. 1, the gate spacing on the source side of the target MOS transistor 11 (that is, the distance between the gate 12 of the target MOS transistor 11 and the gate 17 of the MOS transistor 15) is denoted by the symbol "Ss" and the gate spacing on the drain side (that is, the distance between the gate 12 of the target MOS transistor 11 and the gate 18 of the MOS transistor 16) is denoted by the symbol "Sd".

The inventor has focused on the fact that the gate spacings Ss and Sd affect the threshold voltage of the target MOS transistor 11. More specifically, in the circuit simulation technique in this embodiment, the effect of at least one of the following four phenomena (1) to (4) which affect the threshold voltage is taken into account to improve the accuracy of the circuit simulation.

(1) Gate Spacing Dependency of Impurity Profile in Source/Drain Regions

Figure 2:
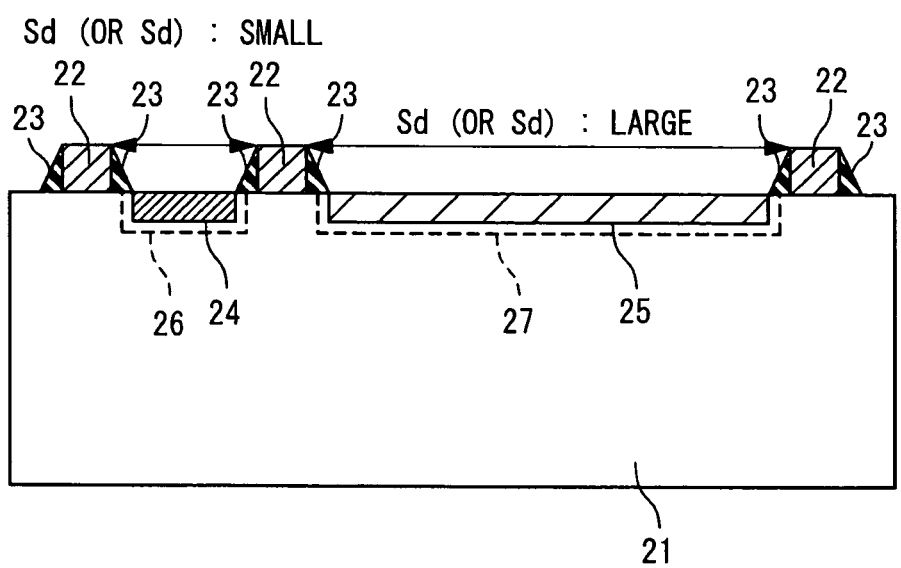
FIG. 2 is a sectional view showing the gate spacing dependency of the impurity profile in a source/drain region.

FIG. 2 is a sectional view explaining the gate spacing dependency of the impurity profile in the source/drain region. In FIG. 2, the numeral 21 denotes a silicon substrate, the numerals 22 denote transistor gates, and the numerals denote sidewalls 23. Furthermore, solid lines 24 and 25 represent the boundaries of the source/drain regions immediately after ion injection and broken lines 26 and 27 represent the boundaries of the source/drain regions after annealing.

Due to lateral diffusion of impurities caused by annealing in the manufacture process, the reduction in the gate spacing lowers the impurity concentration in the source/drain region, and this reduces the junction depth in the source/drain region. The reduction in the junction depth suppresses the short channel effect, as shown in FIG. 3, causing an increase in the threshold voltage and a decrease in the drain current. In other words, the gate spacing dependency of the impurity profile in the source/drain region is observed as the phenomenon that the threshold voltage is increased and the drain current is decreased as the gate spacings Ss and Sd are decreased.

Figure 4:
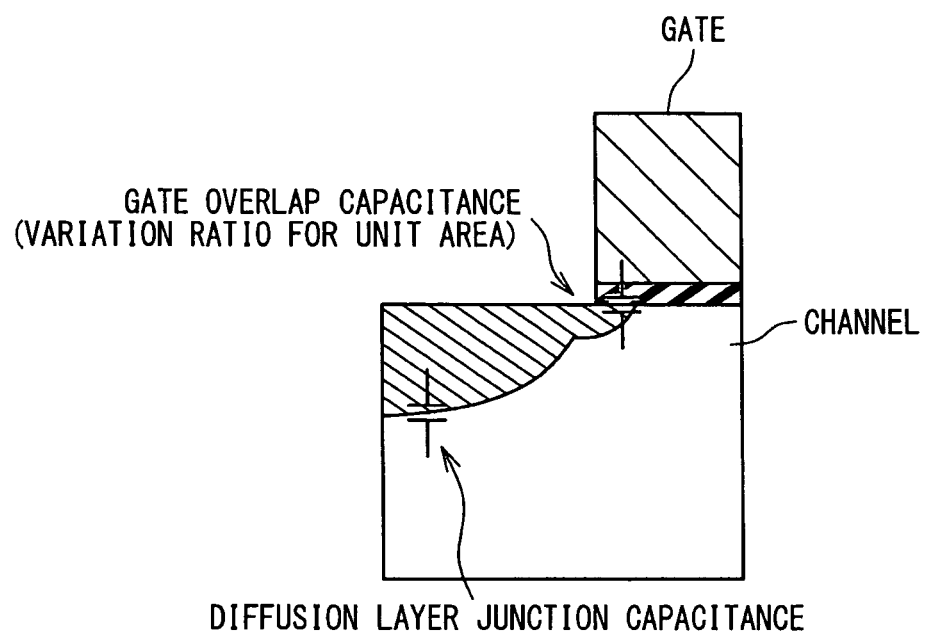
FIG. 4 is a sectional view showing the diffusion layer junction capacitance and the gate overlap capacitance.

In addition, the reduction of the junction depth causes decreases in the diffusion layer junction capacitance of the source/drain and the gate overlap capacitance. It should be noted that the diffusion layer junction capacitance is a capacitance of pn junction formed between the source/drain region and the substrate (or well) and the gate overlap capacitance is a capacitance caused by overlapping of the gate over the source/drain region as shown in FIG. 4. In other words, the gate spacing dependency of the impurity profile in the source/drain region is observed as a phenomenon that the diffusion layer junction capacitance and the gate overlap capacitance decrease as the gate spacings Ss and Sd decrease. It should be noted that the threshold voltage, the drain current, the diffusion layer junction capacitance and the gate overlap capacitance are shown in FIG. 3 as variations from a particular reference value.

(2) Gate Spacing Dependency of Sidewall Width

Figure 5:
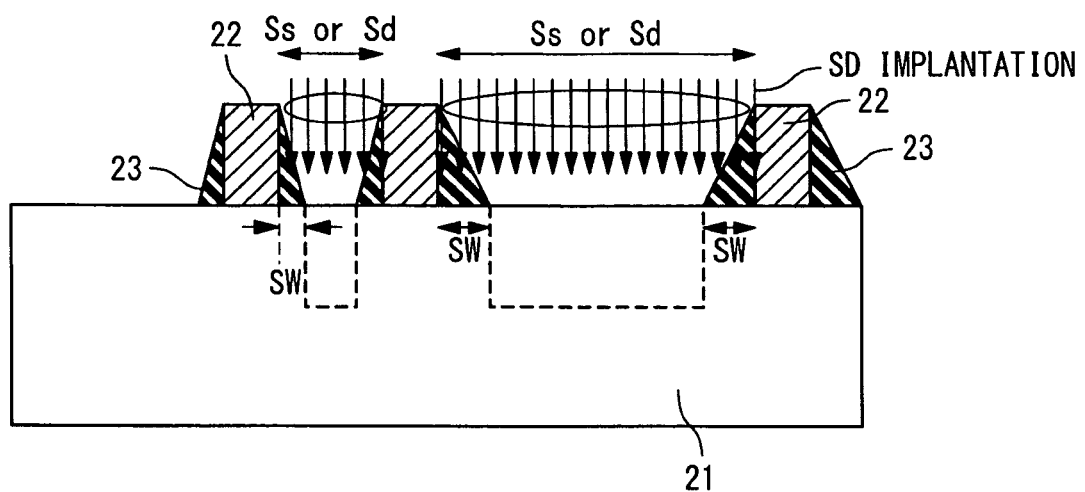
FIG. 5 is a sectional view showing the gate spacing dependency of the sidewall width.
Figure 6:
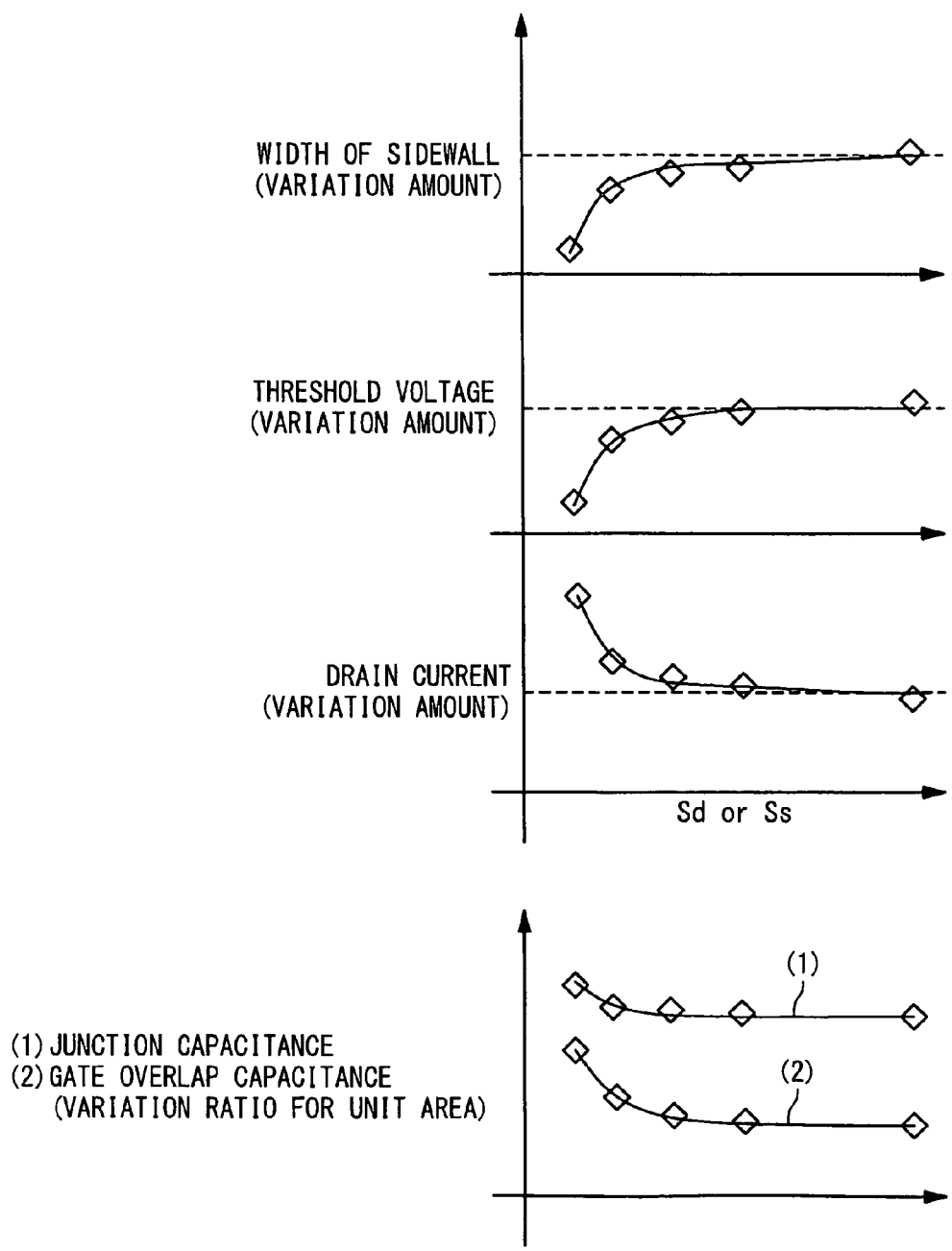
FIG. 6 is a graph showing variations of the threshold voltage, the drain current, the diffusion layer junction capacitance and the gate overlap capacitance due to the gate spacing dependency of the sidewall width.

FIG. 5 is a sectional view showing gate spacing dependency of a sidewall width. In FIG. 5, the symbol SW denotes the sidewall width. In forming sidewalls 23, the actual sidewall width SW is decreased as the gate spacing is decreased. Therefore, variations in the gate spacing leads to variations in the distance between the source/drain region and the channel region in the target transistor, thereby changing the effect of the short channel effect on the transistor characteristics. As a result, as shown in FIG. 6, the threshold voltage and the drain current depend on the gate spacing. The variations in the sidewall width SW also appear as variations in the diffusion layer junction capacitance and the gate overlap capacitance in the source/drain region. As is understood from FIG. 6, the decrease in the gate spacings Ss and Sd causes a decrease in the threshold voltage, a decrease in the drain current, an increase in the diffusion layer junction capacitance and an increase in the gate overlap capacitance. It should be noted that the direction of the variations in the threshold voltage, the drain current, the diffusion layer junction capacitance and the gate overlap capacitance may change depending on conditions of the manufacture process.

(3) Gate Spacing Dependency of Shadowing in Pocket Implantation

Figure 7:
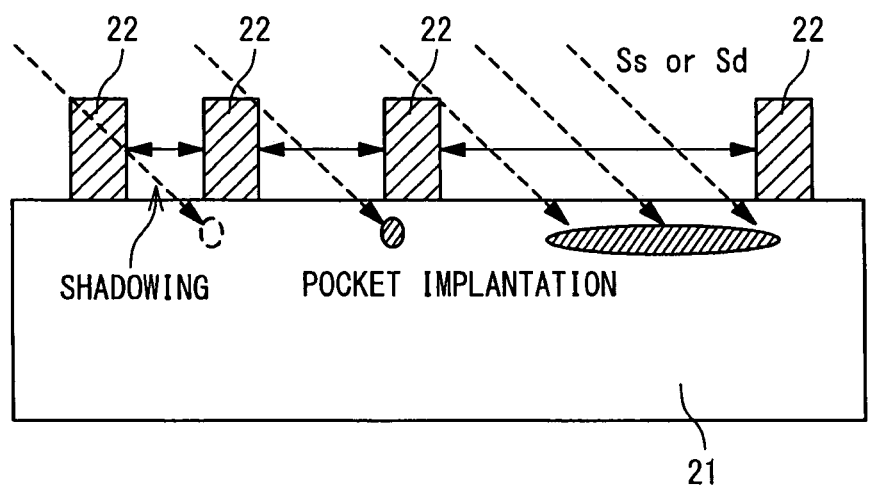
FIG. 7 is a sectional view showing the gate spacing dependency of shadowing in pocket implantation.

FIG. 7 is a sectional view showing gate spacing dependency of shadowing at pocket implantation. The pocket implantation is a process in which impurities of the same type as channel impurities are diagonally injected into the gate electrodes with the wafer rotated after the patterning of the gate electrodes. The pocket implantation effectively suppresses projection of the depletion layer from the drain region and prevents the short channel effect. In the pocket implantation, in which impurities are injected diagonally, impurities are not injected due to the shadowing by the gate when the gate spacing is small. In other words, when the gate spacing is small, the area of the region where the impurities are not injected through the pocket implantation is increased. For this reason, as shown in FIG. 8, the threshold voltage of the transistor depends on the gate spacing due to the effect of the shadowing in the pocket implantation. The gate spacing dependency of the shadowing in the pocket implantation appears as a phenomenon that the reduction in the gate spacings Ss and Sd causes a decrease in the threshold voltage and an increase in the drain current. In addition, the gate spacing dependency of the shadowing in the pocket implantation also appears as a change in the diffusion layer junction capacitance in the source/drain region. Due to the gate spacing dependency of the shadowing in the pocket implantation, the reduction in the gate spacings Ss and Sd causes a decrease in the diffusion layer junction capacitance in the source/drain region.

(4) Gate Spacing Dependency of Actual Gate Dimension

Figure 9:
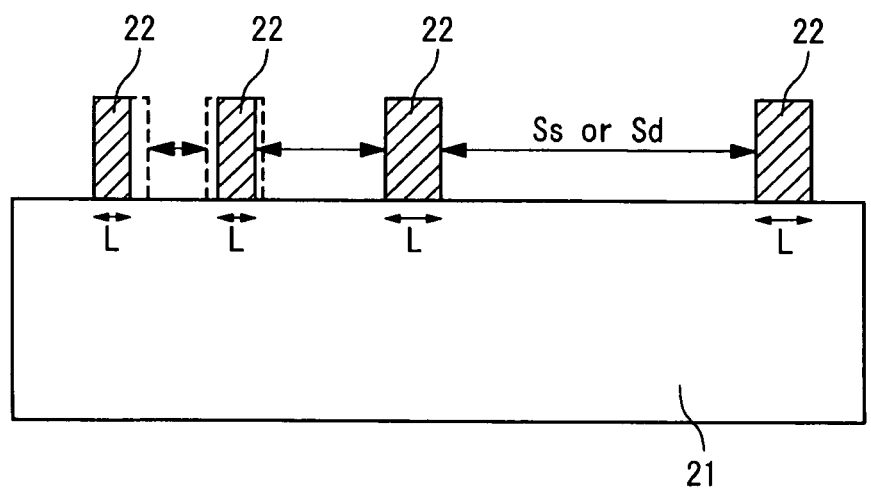
FIG. 9 is a sectional view showing the gate spacing dependency of the actual gate dimension.

FIG. 9 is a sectional view showing the gate spacing dependency of actual gate dimensions. Due to the optic proximity effect, the actual gate length of a MOS transistor is different from the designed gate length (that is, the gate length described in the layout data). In FIG. 9, broken lines indicate the shapes of the gates 22 of the designed gate dimension described in the layout data and solid lines indicate the shapes of the actually formed gates 22.

Figure 10:
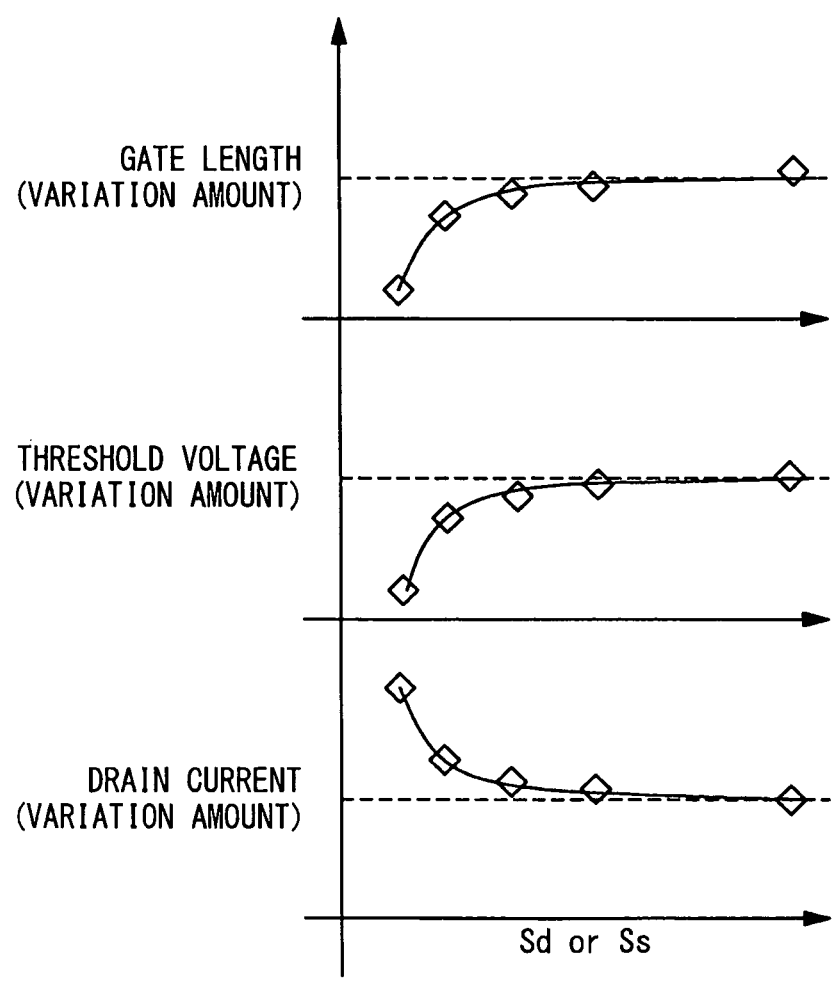
FIG. 10 is a graph showing variations in the threshold voltage and the drain current due to the gate spacing dependency of the actual gate dimension.

Due to the property of the optic proximity effect, the difference between the designed gate length and the actual gate length varies depending on the gate spacing. In other words, the actual gate length of each transistor varies depending on the gate spacing. Since variations in the actual gate length affect the threshold voltage and the drain current, the gate spacing dependency of the actual gate dimension appears as a phenomenon that the threshold voltage and the drain current depend on the gate spacings Ss and Sd. As is understood from FIG. 10, the decreases in the gate spacings Ss and Sd cause a decrease in the threshold voltage and an increase in the drain current. It should be noted that the direction of variations in the threshold voltage and the drain current may change depending on conditions of the manufacture process.

In the following, a detailed description is given of implementation of the circuit simulation based on the above-mentioned four phenomena.

2. Circuit Simulation Implementation

Figure 11:
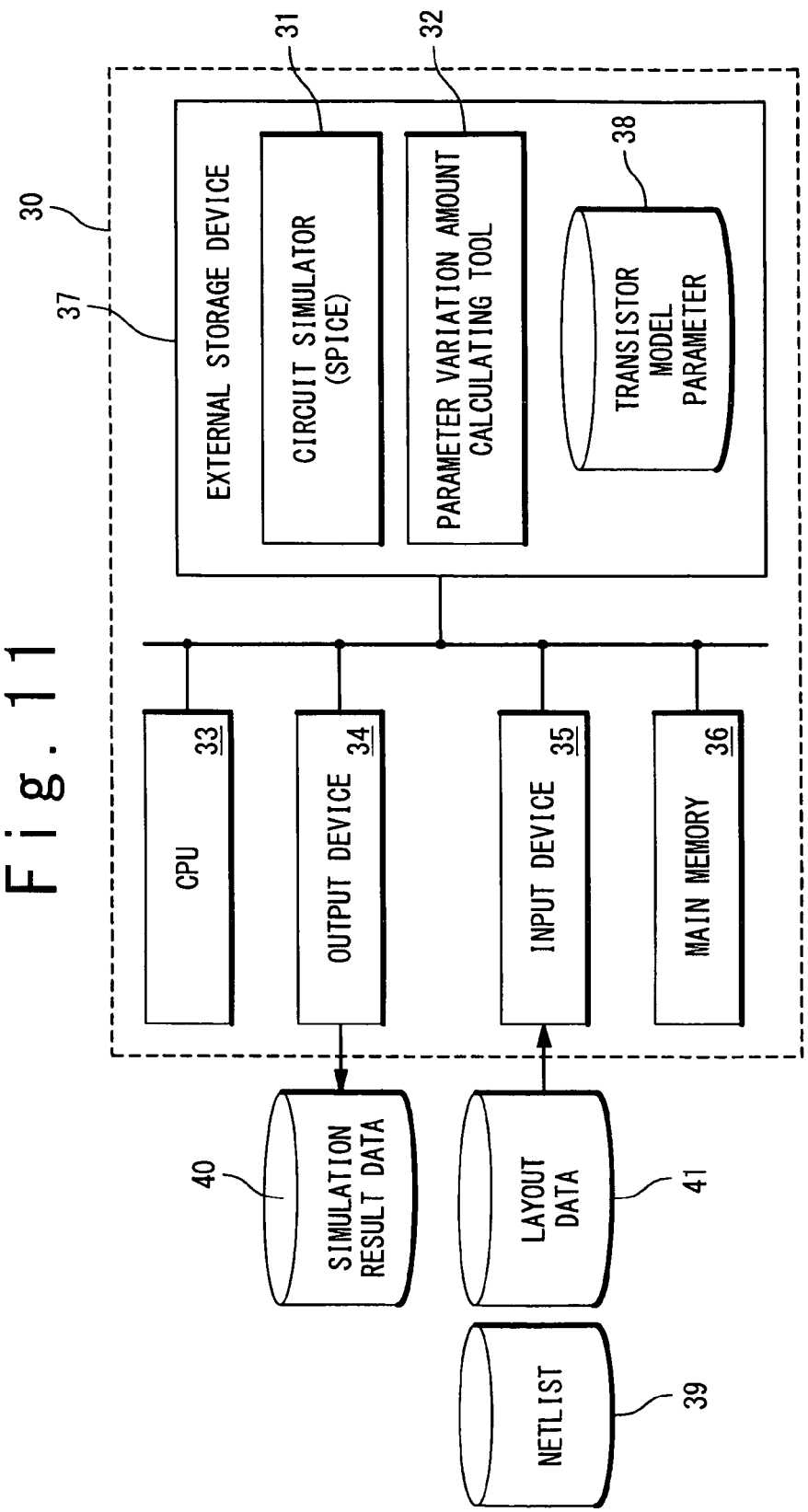
FIG. 11 is a block diagram showing a configuration of a circuit simulation apparatus in one embodiment of the present invention.

FIG. 11 is a block diagram drawing showing an exemplary implementation of the circuit simulation in this embodiment. In this embodiment, a computer installed with a circuit simulator 31 and a parameter modification amount calculating tool 32 is used as a circuit simulation apparatus 30. In detail, the computer is provided with a CPU 33, an output device 34, an input device 35, a main memory 36 and an external storage device 37 (for example, an HDD (hard disk drive)) and the circuit simulator 31 and the parameter modification amount calculating tool 32 are installed onto the external storage device 37. The computer functions as the circuit simulation apparatus 30 when the circuit simulator 31 and the parameter modification amount calculating tool 32 are executed. In one embodiment, the circuit simulator 31 and the parameter modification amount calculating tool 32 are installed onto the circuit simulation apparatus 30 by using a recording medium which records program codes of the circuit simulator 31 and the parameter modification amount calculating tool 32.

The circuit simulator 31 is a software program adapted to simulate integrated circuits by using transistor model parameters described in a transistor model parameter file 38. In this embodiment, the SPICE (Simulation Program with Integrated Circuit Emphasis) is used as the circuit simulator 31 and the transistor model parameters are described in the transistor model parameter file 38 in accordance with a format adapted to the SPICE simulation. For example, transistor model parameters may be described in the BSIM3 (Berkley Short Channel IGFET Model 3) or BSIM4 formats. Although there are various transistor model parameters, a description is only given of parameters vth0, u0 and k2, which are transistor model parameters defined by BSIM3. Here, vth0 is a parameter corresponding to the threshold voltage of the MOS transistor, u0 is a parameter corresponding to channel mobility of the MOS transistor, and k2 is a parameter representing the extent of a back bias effect of the MOS transistor; the drain current of the MOS transistor varies depending on the applied back bias, and k2 is a parameter for representing the extent of the variation in the drain current caused by the application of the back bias. The transistor model parameter file 38 is provided in advance in the external storage device 37. A netlist 39 of an integrated circuit to be simulated is externally provided to the circuit simulator 31. Based on the netlist 39, the circuit simulator 31 performs circuit simulation by using the transistor model parameters described in the transistor model parameter file 38. Results obtained by the circuit simulator 31 are outputted as simulation result data 40 from the output device 34.

The parameter modification amount calculating tool 32 is a tool for extracting layout dimensions of the integrated circuit to be simulated from layout data 41 and calculating parameter modification amounts of each MOS transistor from the extracted layout dimension. Here, the layout data 41 are data describing the layout of the integrated circuit to be simulated and the parameter modification amounts are numerical values representing extents to which the transistor model parameters described in the transistor model parameter file 38 are modified when the circuit simulator 31 actually performs the circuit simulation. The parameter modification amounts associated with the transistor model parameters vth0, u0 and k2 are referred to as $\Delta$vth0, $\Delta$u0 and $\Delta$k2, respectively. The parameter modification amounts $\Delta$vth0, $\Delta$u0 and $\Delta$k2 are calculated for each MOS transistor included in the integrated circuit to be simulated.

Here, transistor model parameters vth0', u0', k2' of a specific MOS transistor actually used in the circuit simulation of the integrated circuit including the MOS transistor are expressed by following equations:

$$vth0'=vth0+\Delta Vth0,$$

$$u0'=u0+\Delta u0, \text{ and}$$

$$k2'=k2+\Delta k2.$$

The circuit simulator 31 calculates the transistor model parameters (vth0', u0', k2' and so on) of the MOS transistor to be actually used in circuit simulation from the parameter modification amounts ($\Delta$vth0, $\Delta$u0, $\Delta$k2 and so on) calculated by the parameter modification amount calculating tool 32 and performs circuit simulation using the calculated transistor model parameters.

A subject matter of circuit simulation in this embodiment is to properly model the relationship between the gate spacings Ss, Sd and the parameter modification amounts, in particular, the relationship between the gate spacings Ss, Sd and the parameter modification amount $\Delta$vth0 according to model formulas. By optimally determining the model formula for obtaining the parameter modification amount $\Delta$vth0 from the gate spacings Ss and Sd, high-accuracy circuit simulation can be achieved in consideration with the gate spacing dependency of the threshold voltage. In addition, by optimally determining the model formula for obtaining the parameter modification amount $\Delta$k2 from the gate spacings Ss and Sd, high-accuracy circuit simulation can be achieved in consideration with the gate spacing dependency of the diffusion layer junction capacitance and the gate overlap capacitance. It should be noted that the phenomenon that the diffusion layer junction capacitance and the gate overlap capacitance vary depending on the gate spacings Ss and Sd can be expressed as the parameter modification amount $\Delta$k2.

Figure 12:
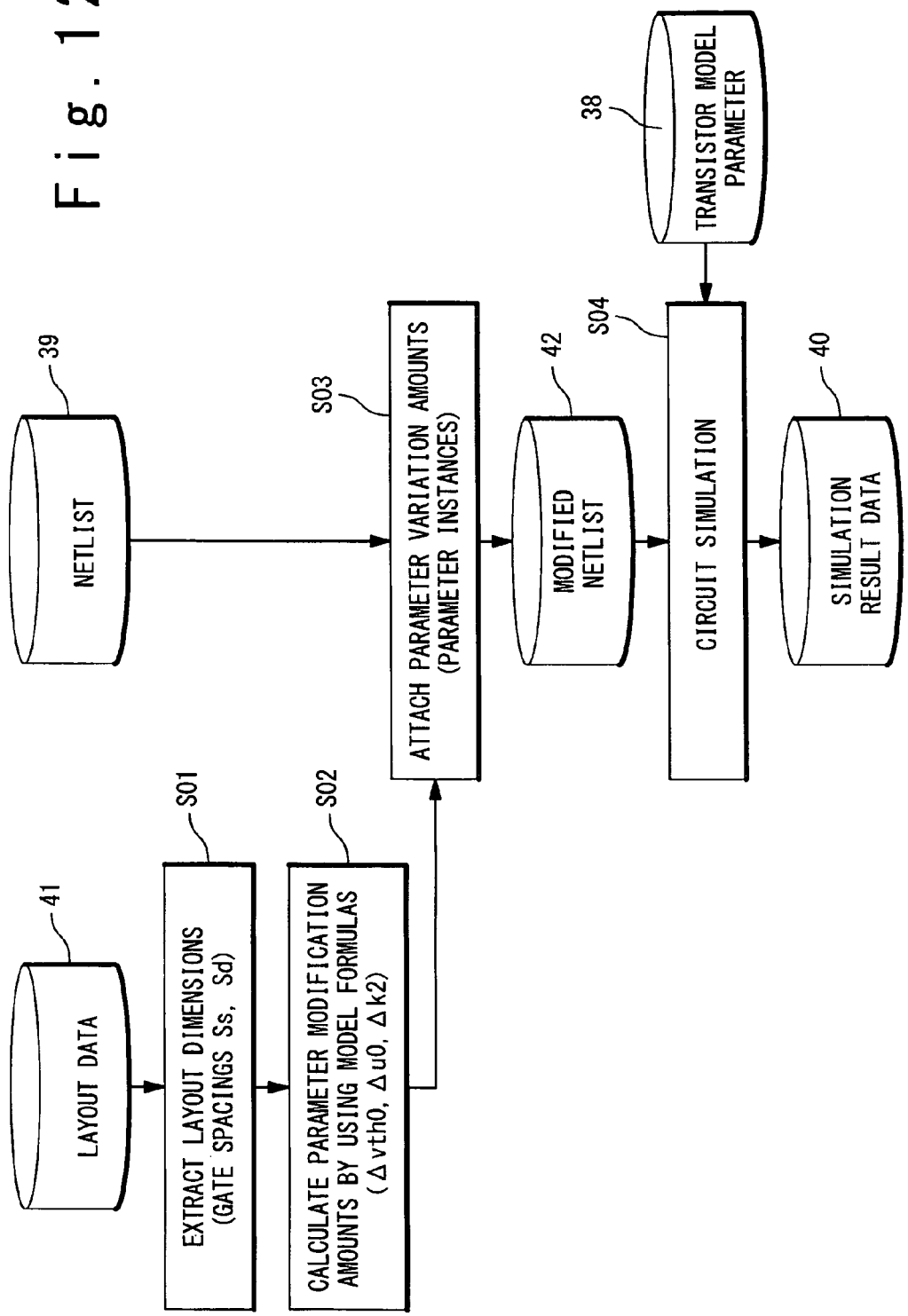
FIG. 12 is a flow chart showing a circuit simulation method in one embodiment of the present invention.

FIG. 12 is a flowchart showing an exemplary procedure of the circuit simulation performed by the circuit simulation apparatus 30. First, layout dimensions of the integrated circuit to be simulated are extracted from the layout data 41 (Step S01). The layout dimensions include the gate spacings Ss and Sd of each MOS transistor of the integrated circuit to be simulated. The layout dimensions are extracted by the parameter modification amount calculating tool 32.

Furthermore, the parameter modification amounts of each MOS transistor are calculated from the extracted layout dimension by using model formulas previously prepared in the parameter modification amount calculating tool 32 (Step S02). As described above, the transistor characteristics of each MOS transistor are affected by the peripheral pattern shape. By calculating the parameter modification amounts of each MOS transistor from the extracted layout dimension, circuit simulation can be achieved in consideration of the effects of the peripheral pattern shape on the transistor characteristics.

In this embodiment, the parameter modification amounts $\Delta$vth0, $\Delta$u0 and $\Delta$k2 are calculated from the gate spacings Ss and Sd of each MOS transistor by using the model formulas. In detail, the model formulas expressing the relationship between the gate spacings Ss, Sd and the parameter modification amounts $\Delta$vth0, $\Delta$u0 and $\Delta$k2 are derived from fitting of measured data and the derived model formulas are previously prepared in the parameter modification amount calculating tool 32. The parameter modification amounts $\Delta$vth0, $\Delta$u0 and $\Delta$k2 are calculated from the gate spacings Ss and Sd by using the model formulas. Terms expressing the above-mentioned phenomena (1) to (4) are introduced into the used model formulas. This allows taking into account the dependency of the parameter modification amounts $\Delta$vth0, $\Delta$u0 and $\Delta$k2 on the gate spacings Ss and Sd caused by the above-mentioned phenomena (1) to (4) in the circuit simulation. The derivation of the model formulas will be described below in detail.

It should be noted that the parameter modification amount $\Delta$vth0 is calculated so as to depend on the gate spacings Ss and Sd through to the model formula in this embodiment. This is important to take into account the phenomenon that the gate spacings Ss and Sd affect the threshold voltage of the target MOS transistor 11 in the circuit simulation.

Figure 13:
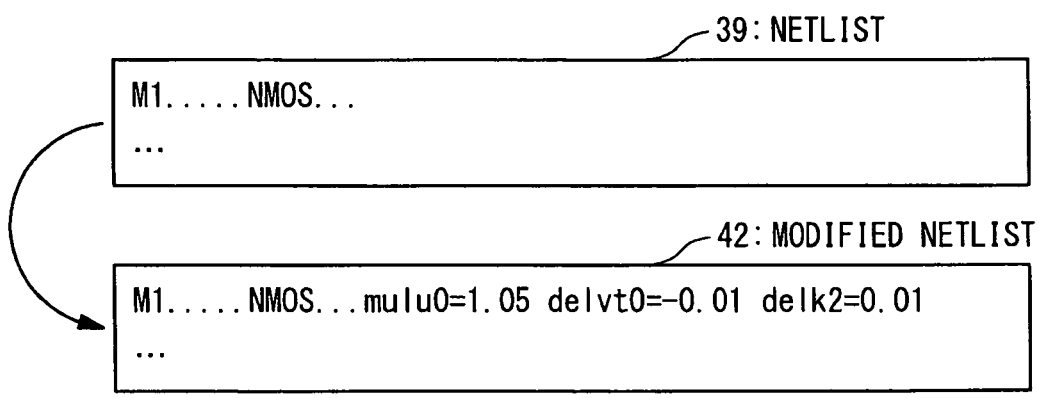
FIG. 13 is a conceptual view showing attachment of parameter modification amounts to a netlist.

The parameter modification amount calculating tool 32 attaches the calculated parameter modification amounts to the netlist 39 (Step S03). Here, the netlist 39 describes elements within the integrated circuit to be simulated and the connections between the elements. The netlist 39 attached with the parameter modification amounts is hereinafter referred to as the modified netlist 42. It should be noted, however, that as shown in FIG. 13, the parameter modification amounts $\Delta$vth0, $\Delta$u0, $\Delta$k2 are converted into instance parameters mulu0, delvt0 and delk2 according to the following equations and described in the modified netlist 42 in this:

$$mulu0 = 1 + \Delta u0/u0,$$

$$delvt0 = \Delta vth0, \text{ and}$$

$$delk2 = \Delta k2.$$

In FIG. 13, "molu0", "delvt0" and "delk2" in the modified netlist 42 represent the instance parameters.

The circuit simulator 31 performs circuit simulation based on the modified netlist 42 (Step S04). In this circuit simulation, the circuit simulator 31 calculates the transistor model parameters to be actually used in the circuit simulation by modifying the transistor model parameters described in the transistor model parameter file 38 in accordance with the parameter modification amounts described in the modified netlist 42. More specifically, the transistor model parameters Vth0', u0' and k2' to be actually used in the circuit simulation are calculated from the transistor model parameters vth0, u0 and k2 and the instance parameters mulu0, delvt0 and delk2 which are described in the transistor model parameter file 38 and the calculated transistor model parameters vth0', u0' and k2' are used for the circuit simulation.

3. Model Formulas

In this embodiment, the above-mentioned phenomena (1) to (4) are taken into the circuit simulation as the model formulas used to calculate the parameter modification amounts $\Delta$vth0, $\Delta$u0 and $\Delta$k2. In the following, a description is given of obtainment of the model formulas.

In this embodiment, a basic function $F_i$ (Ss, Sd) defined in the following is used to represent variations in transistor characteristics depending on the gate spacings Ss and Sd:

$$F_i(Ss, Sd) = a_i \times \left\{ \frac{1}{Ss + b_i} \cdot \frac{Sd + c_i}{Ss + d_i} + \frac{1}{Sd + b_i} \cdot \frac{SS + c_i}{Sd + d_i} \right\} + e_i, \quad (1)$$

where $a_i$ to $e_i$ are model parameters. In Formula (1), the degree of freedom necessary for expressing the variations in the transistor characteristics depending on the gate spacings Ss and Sd are realized by using the five model parameters $a_i$ to $e_i$.

Figure 14A:
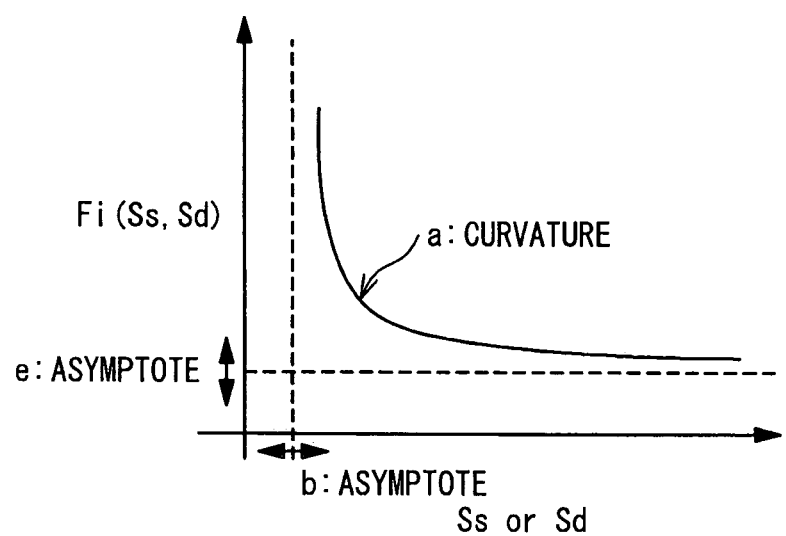
FIG. 14A is a graph showing function values of a basic function $F_i(Ss, Sd)$ in the case where one of the gate spacings Ss and Sd is fixed.
Figure 14B:
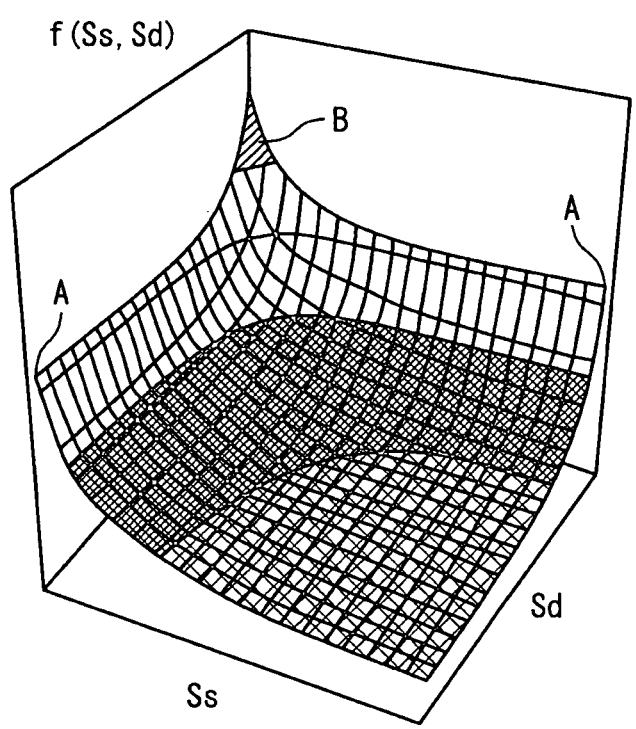
FIG. 14B is a graph showing function values of a basic function $F_i(Ss, Sd)$ in the case where both of the gate spacings Ss and Sd are variable.
Figure 15:
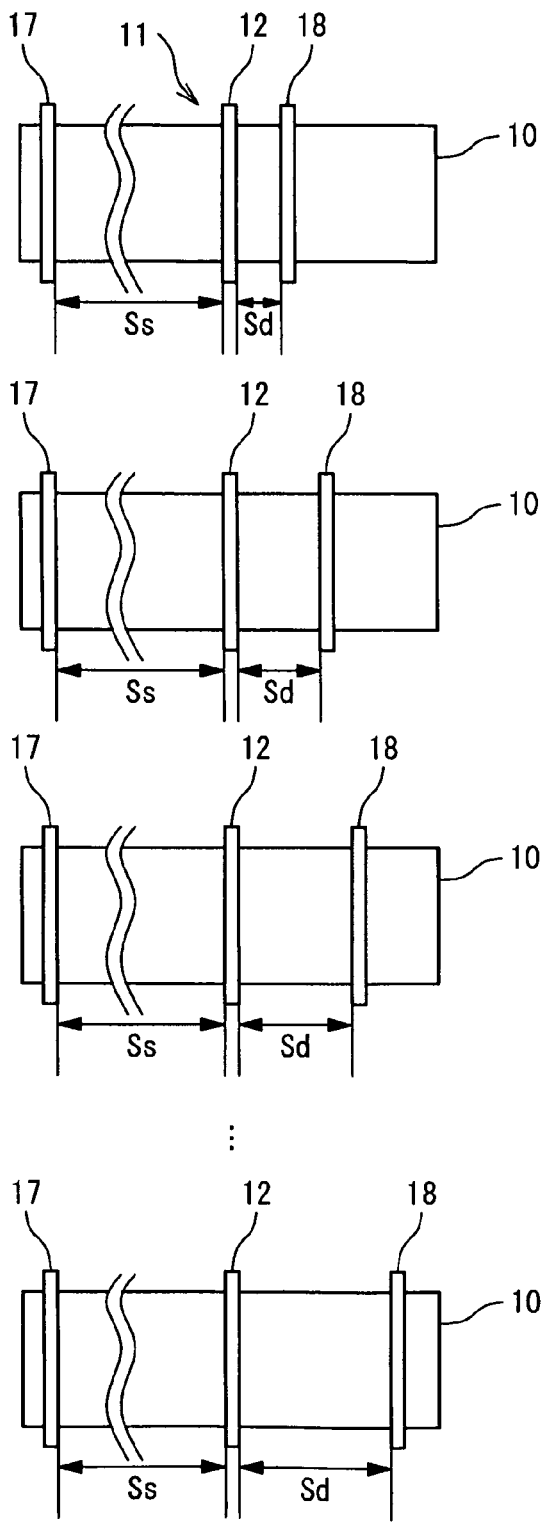
FIG. 15 is a diagram showing exemplary layouts of MOS transistors integrated within a TEG used to determine model parameters of model formulas.
Figure 16:
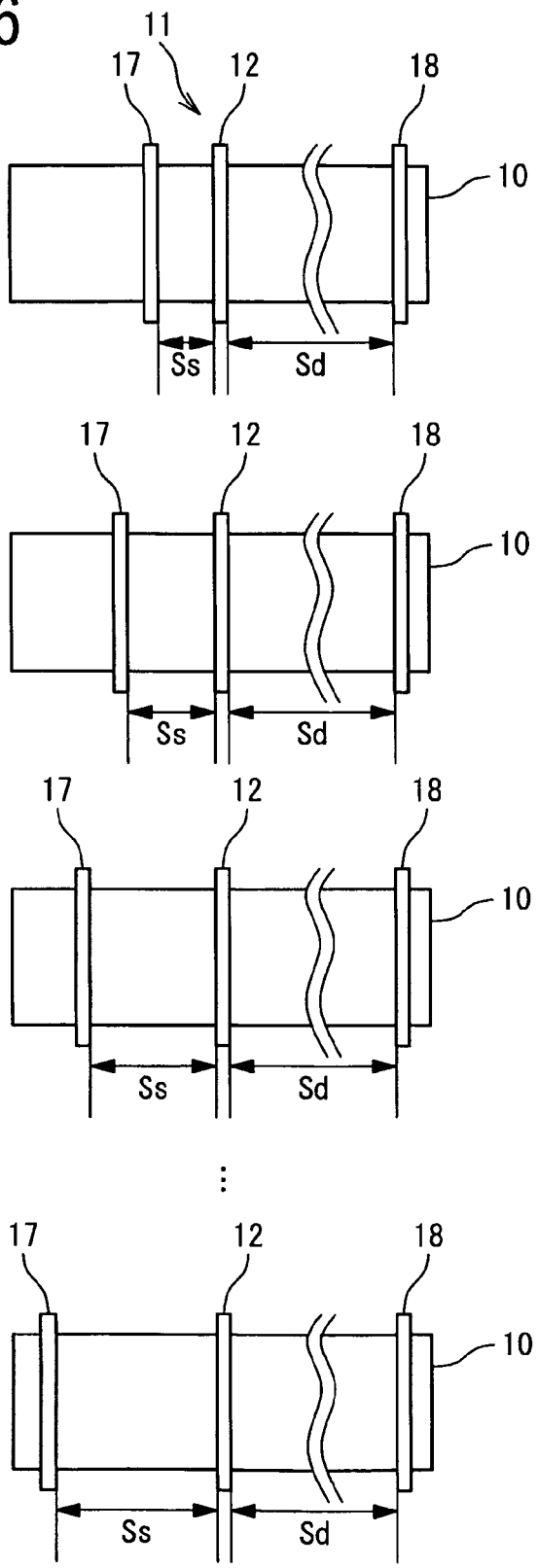
FIG. 16 is a diagram showing exemplary layouts of the MOS transistors integrated within the TEG used to determine the model parameters of the model formulas.
Figure 17:
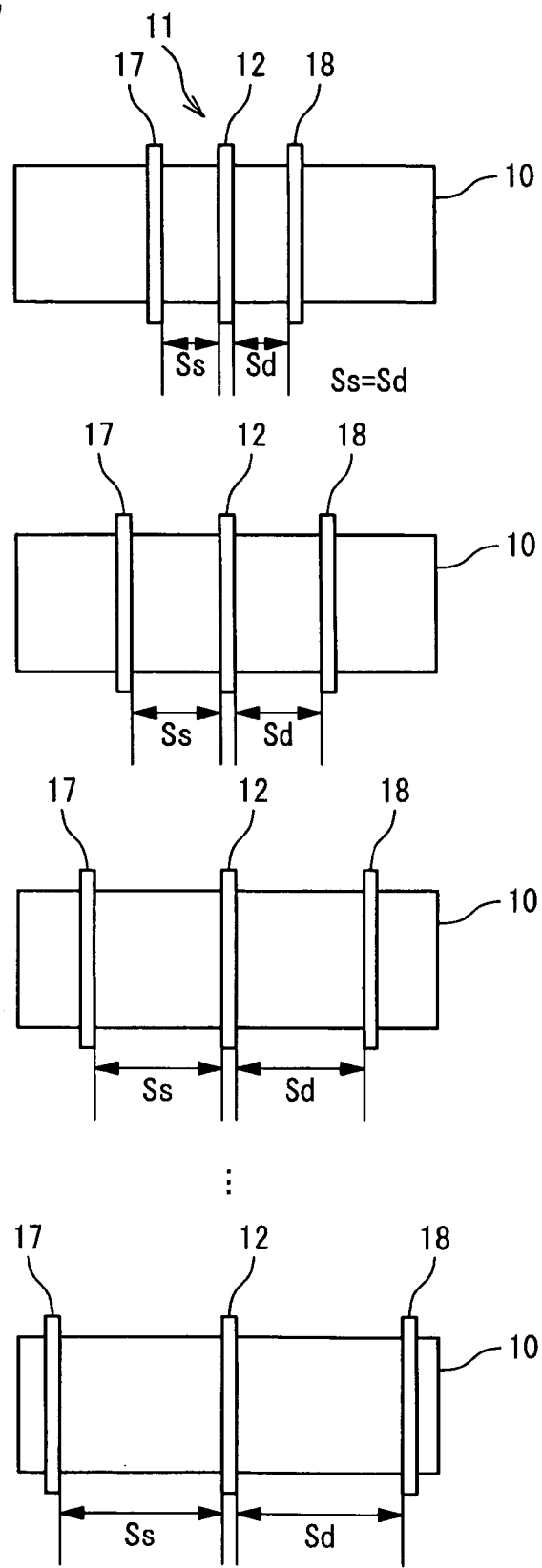
FIG. 17 is a diagram showing exemplary layouts of the MOS transistors integrated within the TEG used to determine the model parameters of the model formulas.
Figure 18A:
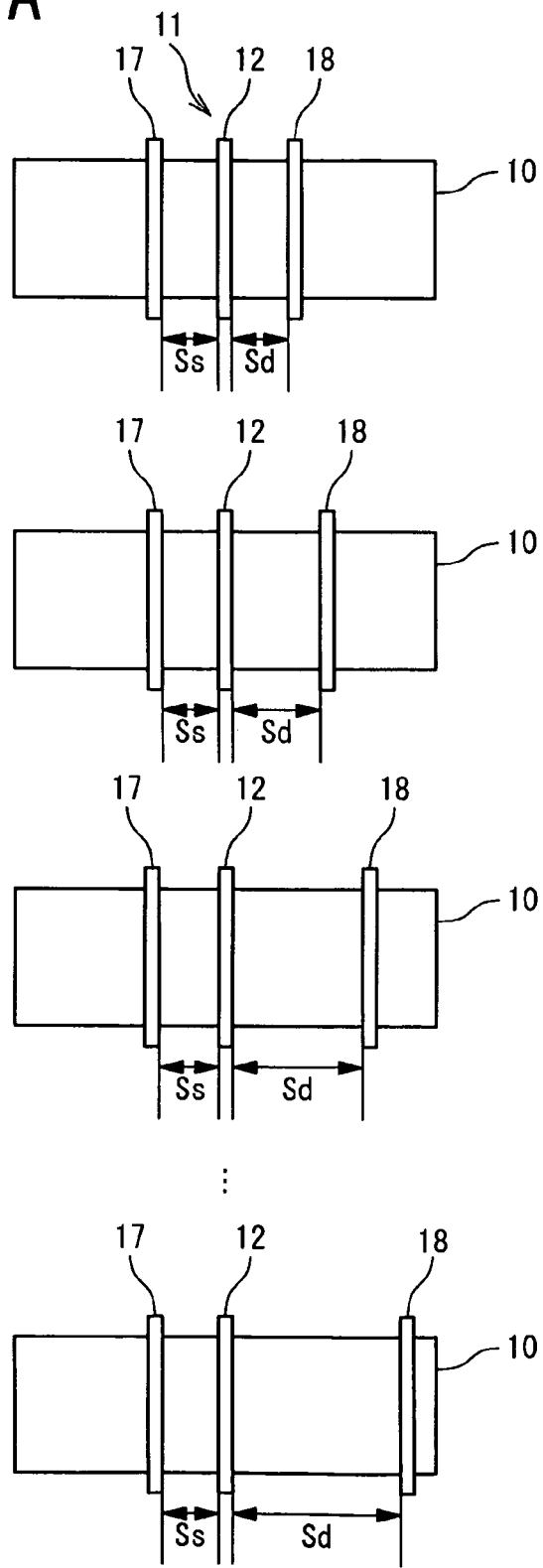
FIG. 18A is a diagram showing exemplary layouts of the MOS transistors integrated within the TEG used to determine the model parameters of the model formulas.
Figure 18B:
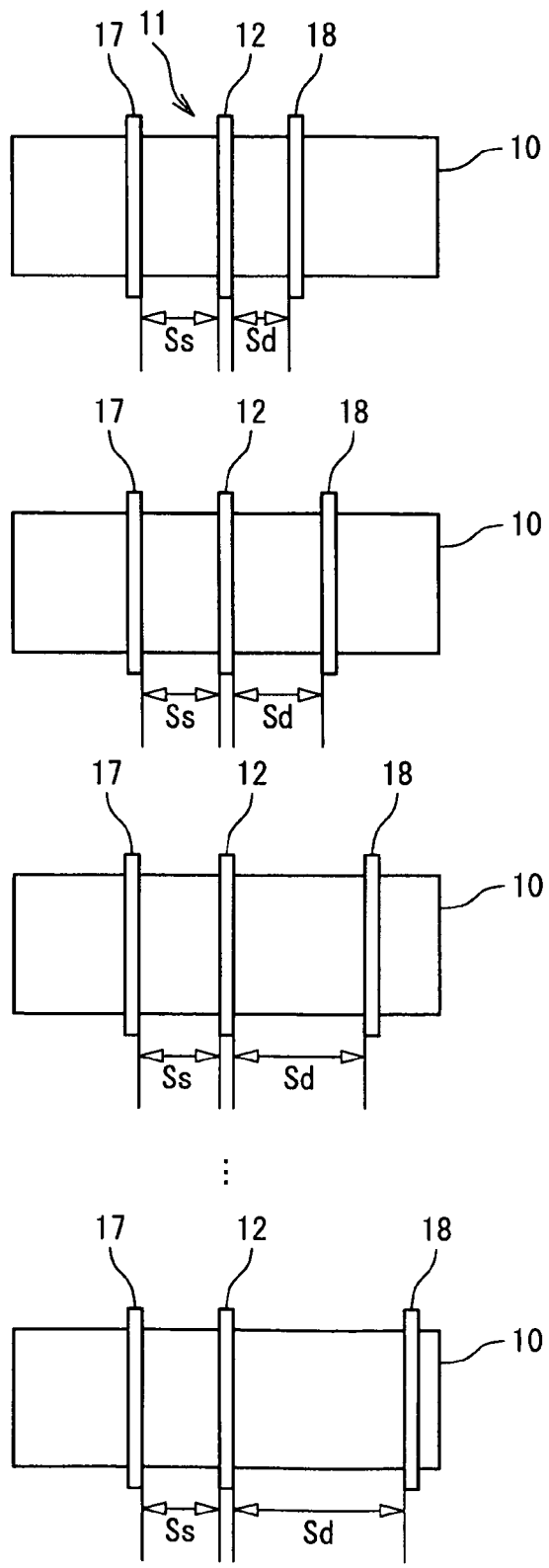
FIG. 18B is a diagram showing exemplary layouts of the MOS transistors integrated within the TEG used to determine the model parameters of the model formulas.
Figure 18C:
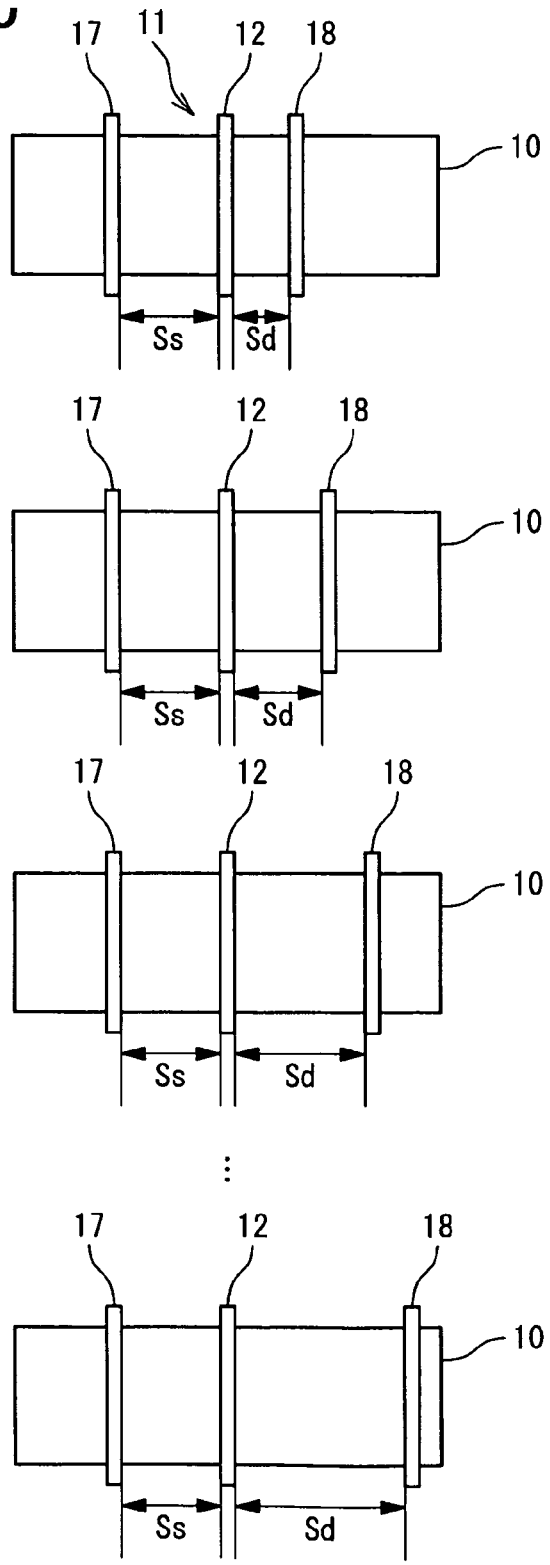
FIG. 18C is a diagram showing exemplary layouts of the MOS transistors integrated within the TEG used to determine the model parameters of the model formulas.

FIG. 14A is a graph showing a curve of a basic function $F_i$ (Ss, Sd) in a case where one of the gate spacings Ss and Sd is fixed, and FIG. 14B is a graph illustrating a face representing the basic function $F_i$ (Ss, Sd) in a three-dimensional rectangular coordinate system. In FIG. 14A, the vertical axis represents the value of the basic function $F_i$ (Ss, Sd) and the horizontal axis represents the gate spacing Ss or Sd. In FIG. 14B, the two axes perpendicular to each other in the in-plane directions represent the gate spacings Ss and Sd and the vertical axis represents $F_i$ (Ss, Sd).

The basic function $F_i$ (Ss, Sd) defined by Formula (1) has properties described in the following: The basic function $F_i$ (Ss, Sd) monotonically decreases with respect to each of the gate spacings Ss and Sd and rapidly increases as the gate spacings Ss and Sd decrease. In detail, for Ss, Sd>0, the partial differentiation $\partial F_i/\partial Ss$ of the basic function $F_i$ (Ss, Sd) with respect to the gate spacing Ss is negative and monotonically increases as Ss increases to converge to 0. Similarly, for Ss, Sd>0, the partial differentiation $\partial F_i/\partial Sd$ of the basic function $F_i$ (Ss, Sd) with respect to the gate spacing Sd is negative and monotonically increases as Sd increases to converge to 0.

The model parameter $a_i$ of the basic function $F_i$ (Ss, Sd) is an inverse proportional coefficient and determines the curvature of the curved face represented by the basic function $F_i$ (Ss, Sd). The model parameter $b_i$ determines the position of the asymptote parallel to the axis corresponding to $F_i$ (Ss, Sd). The model parameters $c_i$ and $d_i$ determine the ratio of a point A to a point B in FIG. 14B based on the ratio of the model parameter $c_i$ to the model parameter $d_1$. The model parameter $e_i$ determines the position of the asymptote perpendicular to the axis corresponding to $F_i$ (Ss, Sd).

In Formula (1), the basic function $F_i$ (Ss, Sd) is defined on an assumption that variations in transistor characteristics depending on the gate spacings Ss and Sd are symmetrical about the source-side gate spacing Ss and the drain-side gate spacing Sd. To simulate a phenomenon that variations in the transistor characteristics are asymmetrical about the source side-gate spacing Ss and the drain-side gate spacing Sd, the basic function $F_i$ (Ss, Sd) may be defined according to Formula (2):

$$F_i(Ss, Sd) = a_i \times \left\{ \frac{1}{Ss + b_i} \cdot \frac{Sd + c_i}{Ss + d_i} + \frac{1}{Sd + e_i} \cdot \frac{SS + f_i}{Sd + g_i} \right\} + h_i, \quad (2)$$

In Formula (2), the degree of freedom necessary for expressing the variations in the transistor characteristics depending on the gate spacings Ss and Sd are realized by using eight model parameters $a_i$ to $e_i$.

To simulate sharp variations in the transistor characteristics, the basic function $F_i$ (Ss, Sd) may be defined according to the following Formula (3):

$$F_i(Ss, Sd) = a_i \times \left\{ \begin{array}{c} \frac{1}{Ss + b_i} \cdot \frac{Sd + c_i}{Ss + d_i} + \\ \frac{1}{(Sd + e_i)^N} \cdot \frac{Ss + f_i}{Sd + g_i} \end{array} \right\} + h_i, \quad (3)$$

where N is a constant.

In one embodiment, one or more phenomena to be considered in the circuit simulation selected among the above-mentioned four phenomena (1) to (4) are each correlated with the basic function $F_i$ (Ss, Sd) and the parameter modification amounts $\Delta$vth0, $\Delta$u0 and $\Delta$k2 are expressed by the following model formula which is a linear combination of functions $F_i$ (Ss, Sd).

$$\Delta vth0(Ss, Sd) = \sum_i \alpha_{vth0\_i} \cdot F_i(Ss, Sd), \quad (4)$$

$$\Delta u0(Ss, Sd) = \sum_i \alpha_{u0\_i} \cdot F_i(Ss, Sd),$$

$$\Delta k2(Ss, Sd) = \sum_i \alpha_{k2\_i} \cdot F_i(Ss, Sd).$$

where $\alpha_{vth0\_i}$ is a sensitivity coefficient for the parameter modification amount $\Delta$vth0 associated with the characteristic variation phenomenon depending on the gate spacing, $\alpha_{u0\_i}$ is a sensitivity coefficient of the parameter modification amount $\Delta$u0 and $\alpha_{k2\_i}$ is a sensitivity coefficient for the parameter modification amount $\Delta$k2. The symbol "$\Sigma$" means a sum about the phenomena to be considered in the circuit simulation among the above-mentioned four phenomena (1) to (4).

When all of the above-mentioned four phenomena (1) to (4) are considered in the circuit simulation, for example, the basic functions $F_1$ (Ss, Sd) to $F_4$ (Ss, Sd) are correlated with the phenomena (1) to (4), respectively. In this case, as described in the following, the parameter modification amounts $\Delta$vth0, $\Delta$u0 and $\Delta$k2 are expressed by model formulas which are linear combinations of the functions $F_1$ (Ss, Sd) to $F_4$ (Ss, Sd):

$$\Delta vth0(Ss, Sd) = \sum_{i=1}^{4} \alpha_{vth0\_i} \cdot F_i(Ss, Sd), \quad (4')$$

$$\Delta u0(Ss, Sd) = \sum_{i=1}^{4} \alpha_{u0\_i} \cdot F_i(Ss, Sd),$$

$$\Delta k2(Ss, Sd) = \sum_{i=1}^{4} \alpha_{k2\_i} \cdot F_i(Ss, Sd).$$

Here, $\alpha_{vth0\_1} \cdot F_1$ (Ss, Sd), $\alpha_{u0\_1} \cdot F_1$ (Ss, Sd), $\alpha_{k2\_1} \cdot F_1$ (Ss, Sd) in Formula (4') are terms corresponding to the phenomenon (1) and $\alpha_{vth0\_2} \cdot F_2$ (Ss, Sd), $\alpha_{u0\_2} \cdot F_2$ (Ss, Sd), $\alpha_{k2\_2} \cdot F_2$ (Ss, Sd) are terms corresponding to the phenomenon (2). Similarly, $\alpha_{vth0\_3} \cdot F_3$ (Ss, Sd), $\alpha_{u0\_3} \cdot F_3$ (Ss, Sd), $\alpha_{k2\_3} \cdot F_3$ (Ss, Sd) are terms corresponding to the phenomenon (3) and $\alpha_{vth0\_4} \cdot F_4$ (Ss, Sd), $a_{u0\_4} \cdot F_4$ (Ss, Sd), $\alpha_{k2\_4} \cdot F_4$ (Ss, Sd) are terms corresponding to the phenomenon (4).

The model parameters $a_i$ to $e_i$ (or $a_i$ to $h_i$) and the sensitivity coefficients $\alpha_{vtho\_i}$, $\alpha_{u0\_i}$, $\alpha_{k2\_i}$ of $F_i$ (Ss, Sd) in Formula (4) or Formula (4') can be determined by performing parameter fitting with respect to measured data obtained through measurement of characteristics of MOS transistors with different designed values of the gate spacings Ss and Sd. In detail, MOS transistors with different gate spacings Ss and Sd are integrated into a TEG (test element group) and characteristics of the transistors are measured. FIGS. 15, 16, 17, 18A to 18C are diagrams showing examples of the layouts of the MOS transistors integrated in TEGs. In these figures, the reference numerals 10 denote active regions. The reference numerals 11 denote the MOS transistors, characteristics of which are to be measured, and the reference numerals 12 denote the gates of the MOS transistors 11. The reference numerals 17 denote the gates adjacent to the gates 12 on the source side of the MOS transistors 11 and the reference numerals 18 denote the gates adjacent to the gates 12 on the drain side of the MOS transistors 11.

In one embodiment, the following MOS transistors are prepared in the TEGs and the transistor characteristics thereof are measured:
(a) MOS transistors in which the gate spacing Ss on the source side is sufficiently large to an extent that there causes no variation in the transistor characteristics, while the gate spacing Sd on the drain side is varied (refer to FIG. 15);
(b) MOS transistors in which the gate spacing Sd on the drain side is sufficiently large to an extent that there causes no variation in the transistor characteristics, while the gate spacing Ss on the source side is varied (refer to FIG. 16);
(c) MOS transistors in which the gate spacing Ss on the source side is the same as the gate spacing Sd on the drain side, and the gate spacings Ss and Sd are varied (refer to FIG. 17); and
(d) MOS transistors in which the source-side and drain-side gate spacings Ss and Sd are independently varied (refer to FIG. 18A to FIG. 18C).

The transistor model parameters Vth0, u0 and k2 of each of the MOS transistors with different gate spacings Ss and Sd, which are integrated into the TEG, are extracted from the measured transistor characteristics. Furthermore, the parameter modification amounts $\Delta$vth0, $\Delta$u0 and $\Delta$k2 are calculated as differences between the extracted transistor model parameters vth0, u0, k2 and vth0, u0, k2 described in the transistor model parameter file 38, respectively. This allows obtaining data indicating associations of the gate spacings Ss and Sd with the parameter modification amounts $\Delta$vth0, $\Delta$u0 and $\Delta$k2. The model parameters $a_i$ to $e_i$ (or $a_i$ to $h_i$) and the sensitivity coefficients $\alpha_{vth0\_i}$, $\alpha_{u0\_i}$, $\alpha_{k2\_i}$ of $F_i$ (Ss, Sd) in Formula (4) or Formula (4') can be determined from the obtained data by data fitting.

The above-mentioned method in which the model parameters $a_i$ to $e_i$ (or $a_i$ to $h_i$) and the sensitivity coefficients $\alpha_{vth0\_i}$, $\alpha_{u0\_i}$ and $a_{k2\_i}$ are directly determined by data fitting may cause a problem that a large amount of calculation is required. From inventors' consideration, when a variation in the threshold voltage is minute, the model parameters $a_i$ to $e_i$ (or $a_i$ to $h_i$) and the sensitivity coefficients $\alpha_{vth0\_i}$, $\alpha_{u0\_i}$, $a_{k2\_i}$ can be determined by data fitting with a reduced amount of calculation by using a fact that the variation in the threshold voltage is linearly related to the variation in the drain current. A procedure of determining the model parameters $a_i$ to $e_i$ (or $a_i$ to $h_i$) and the sensitivity coefficients $\alpha_{vth0\_i}$, $\alpha_{u0\_i}$ and $a_{k2\_i}$ by using the linear relationship between the variation in the threshold voltage and the variation in the drain voltage will be described below.

First, transistor characteristics of the MOS transistors with different gate spacings Ss and Sd, more specifically, Id-Vg characteristics and Id-Vd characteristics, are measured. In one embodiment, transistor characteristics of the MOS transistors having layouts shown in FIGS. 15, 16, 17, 18A to 18C are measured. As described above, the MOS transistors, characteristics of which are measured, are integrated into a TEG.

Subsequently, the variation amount $\Delta$Vt of the threshold voltage is modeled. Here, the variation amount $\Delta$Vt is a difference from the threshold voltage Vt (Ss_std, Sd_std) of the MOS transistor in which the gate spacings Ss and Sd are certain reference values Ss_std, Sd_std. In other words, the variation amount $\Delta$Vt is expressed as a following Formula.

$$\Delta Vt(Ss,Sd)=Vt(Ss,Sd)-Vt(Ss\_std,Sd\_std),$$

where the threshold voltage of the MOS transistor in which the gate spacings on the source side and the drain side are Ss and Sd, respectively, is defined as Vt(Ss, Sd). In this embodiment, the reference values Ss_std, Sd_std are defined as the source-side and drain-side gate spacings of the MOS transistor used to extract the transistor model parameters described in the transistor model parameter file 38.

In this modeling, $\Delta$Vt (Ss, Sd) is expressed by the following model formula, which includes the above-mentioned basic functions $F_i$ (Ss, Sd).

$$\Delta Vt(Ss, Sd) = \sum_i F_i(Ss, Sd) + A, \quad (5)$$

where the symbol $\Sigma$ means the sum for the phenomena to be considered in the circuit simulation among the above-mentioned four phenomena (1) to (4) and A is a constant term. For example, when the phenomena (1) and (2) are considered in the circuit simulation, $\Delta$Vt (Ss, Sd) is expressed by a following Formula:

$$\Delta Vt(Ss,Sd)=F_1(Ss,Sd)+F_2(Ss,Sd)-A, \quad (5')$$

where $F_1$ (Ss, Sd) is a term for representing the gate spacing dependency of the impurity profile in the source/drain region and $F_2$ (Ss, Sd) is a term for representing the gate spacing dependency of the sidewall width.

The model parameters $a_i$ to $e_i$ (or $a_i$ to $h_i$) of the function $F_i$ (Ss, Sd) in Formula (5) (or Formula (5')) are determined by performing data fitting of measured values of the variation amount $\Delta Vt$ (Ss, Sd) of the threshold voltage, which are obtained from the Id-Vg characteristics and the Id-Vd characteristics. This allows obtaining a model formula of $\Delta Vt$ (Ss, Sd).

When two or more phenomena out of the above-mentioned four phenomena (1) to (4) are considered in the circuit simulation, convergence of data fitting may be weak, since the model parameters of the variation amount $\Delta Vt$ (Ss, Sd) of the threshold voltage may be dependent on each other. To improve convergence of data fitting, it is effective to determine model parameters which can be determined from the sectional shape of the MOS transistor integrated in the TEG, prior to data fitting. For example, the sidewall widths SW of the MOS transistors integrated in the TEG may be measured from a sectional TEM (transmission electro microscope) image, and some of the model parameters of $F_2$ (Ss, Sd), which is a term for expressing the gate spacing dependency of the sidewall width, may be determined from the measured sidewall widths SW. This allows extracting model parameters more correctly in terms of physical aspects.

Furthermore, two types of coefficients are calculated: (a) the sensitivity coefficient $\alpha_{Id}$ of the variation amount $\Delta Id$ of the drain current with respect to the variation amount $\Delta Vt$ of the threshold voltage in the case where back bias is 0 (that is, the back gate to source voltage is 0) and (b) the sensitivity coefficient $\alpha_{Id\_b}$ of the variation amount $\Delta Id\_b$ of the drain current with respect to the variation amount $\Delta Vt$ of the threshold voltage in the case where the back bias is a predetermined value other than 0 (that is, the back gate to source voltage is a predetermined value other than 0). Here, the variation amount $\Delta Id$ is the difference from the drain current Id (Ss_std, Sd_std) of the MOS transistor in which the gate spacings Ss and Sd are the certain reference values Ss_std, Sd_std in the case where the back bias is 0 and similarly, the variation amount $\Delta Id\_b$ is the difference from the drain current Id (Ss_std, Sd_std) of the MOS transistor in which the gate spacings Ss and Sd are the certain reference values Ss_std, Sd_std in the case where the back bias is a predetermined value other than 0. In detail, based on the measured Id-Vg characteristics and Id-Vd characteristics, the measured value of the variation amount $\Delta Ib$ (Ss, Sd) of the drain current in the case where the back bias is 0 and the measured value of the variation amount $\Delta Ib\_0$ (Ss, Sd) of the drain current in the case where the back bias is the predetermined value can be obtained. The sensitivity coefficients $\alpha_{Id}$, $\alpha_{Id\_b}$ are calculated from the measured values of the $\Delta Vt$ (Ss, Sd), $\Delta Id$ (Ss, Sd), $\Delta Id\_b$ (Ss, Sd) according to the following formulas:

$$\alpha_{Id} = \Delta Id(Ss,Sd)/\Delta Vt(Ss,Sd),$$

$$\alpha_{Id\_b} = \Delta Id\_b(Ss,Sd)/\Delta Vt(Ss,Sd).$$

Here, from the viewpoint of uniformity in the notation, the sensitivity coefficient of the variation amount of the threshold voltage with respect to the variation amount of the threshold voltage is defined as $\alpha_{Vt}$. According to this definition, the sensitivity coefficients $\alpha_{Id}$, $\alpha_{Vt}$, $\alpha_{Id\_b}$ are expressed by following formulas.

$$\alpha_{Id} = \Delta Id(Ss,Sd)/\Delta Vt(Ss,Sd), \quad (6)$$

$$\alpha_{Vt} = \Delta Vt(Ss,Sd)/\Delta Vt(Ss,Sd), \text{ and} \quad (7)$$

$$\alpha_{Id\_b} = \Delta Id\_b(Ss,Sd)/\Delta Vt(Ss,Sd) \quad (8)$$

Since the model formula of $\Delta Vt$ (Ss, Sd) is obtained as mentioned above, $\Delta Id$ (Ss, Sd), $\Delta Vt$ (Ss, Sd) and $\Delta Id\_b$ (Ss, Sd) can be modeled according to the following formulas by using the model formula of $\Delta Vt$ (Ss, Sd) and the sensitivity coefficients $\alpha_{Id}$, $\alpha_{Vt}$, $\alpha_{Id\_b}$:

$$\Delta Id(Ss,Sd) = \Delta Vt(Ss,Sd) \times \alpha_{Id}, \quad (9)$$

$$\Delta Vt(Ss,Sd) = \Delta Vt(Ss,Sd) \times \alpha_{Vt}, \text{ and} \quad (10)$$

$$\Delta Id\_b(Ss,Sd) = \Delta Vt(Ss,Sd) \times \alpha_{Id\_b}. \quad (11)$$

Meanwhile, when variations in the threshold voltage are minute and the variations in the threshold voltage are linear to variations in the drain voltage, the variation amounts $\Delta Id$, $\Delta Vt$, $\Delta Id\_b$ are expressed as following formulas:

$$\Delta Id = \frac{\partial Id}{\partial u0} \cdot \Delta u0 + \frac{\partial Id}{\partial vth0} \cdot \Delta vth0 + \frac{\partial Id}{\partial k2} \cdot \Delta k2, \quad (12)$$

$$\Delta Vt = \frac{\partial Vt}{\partial u0} \cdot \Delta u0 + \frac{\partial Vt}{\partial vth0} \cdot \Delta vth0 + \frac{\partial Vt}{\partial k2} \cdot \Delta k2, \quad (13)$$

$$\Delta Id\_b = \frac{\partial Id\_b}{\partial u0} \cdot \Delta u0 + \frac{\partial Id\_b}{\partial vth0} \cdot \Delta vth0 + \frac{\partial Id\_b}{\partial k2} \cdot \Delta k2, \quad (14)$$

Formulas (12) to (14) are represented using a matrix as follows:

$$\begin{pmatrix} \Delta Id \\ \Delta Vt \\ \Delta Id\_b \end{pmatrix} = \begin{pmatrix} \frac{\partial Id}{\partial u0} & \frac{\partial Id}{\partial vth0} & \frac{\partial Id}{\partial k2} \\ \frac{\partial Vt}{\partial u0} & \frac{\partial Vt}{\partial vth0} & \frac{\partial Vt}{\partial k2} \\ \frac{\partial Id\_b}{\partial u0} & \frac{\partial Id\_b}{\partial vth0} & \frac{\partial Ib\_b}{\partial k2} \end{pmatrix} \begin{pmatrix} \Delta u0 \\ \Delta Vth0 \\ \Delta k2 \end{pmatrix}. \quad (15)$$

By deforming Formula (15), the following Formula (16) is obtained:

$$\begin{pmatrix} \Delta u0 \\ \Delta Vth0 \\ \Delta k2 \end{pmatrix} = \begin{pmatrix} \frac{\partial Id}{\partial u0} & \frac{\partial Id}{\partial vth0} & \frac{\partial Id}{\partial k2} \\ \frac{\partial Vt}{\partial u0} & \frac{\partial Vt}{\partial vth0} & \frac{\partial Vt}{\partial k2} \\ \frac{\partial Id\_b}{\partial u0} & \frac{\partial Id\_b}{\partial vth0} & \frac{\partial Ib\_b}{\partial k2} \end{pmatrix}^{-1} \begin{pmatrix} \Delta Id \\ \Delta Vt \\ \Delta Id\_b \end{pmatrix}. \quad (16)$$

Formula (16) means that each of the transistor model parameters $\Delta u0$, $\Delta vth0$ and $\Delta k2$ is expressed as linear combination of the variation amounts $\Delta Id$, $\Delta Vt$, and $\Delta Id\_b$. Each component of the inverse matrix of Formula (16) can be obtained by a SPICE circuit simulation.

The parameter modification amounts are calculated at Step S02 by using Formula (5) (or Formula (5')), Formulas (9) to (11) and Formula (16). In detail, the variation amount $\Delta Vt$ (Ss, Sd) of the threshold voltage is calculated from the extracted gate spacings Ss and Sd according to Formula (5). Furthermore, according to Formulas (9) to (11), the variation amount $\Delta Id$ (Ss, Sd) of the drain current in the case where the back bias is 0 and the variation amount $\Delta Id\_b$ (Ss, Sd) of the drain current in the case where the back bias is the predetermined value other than 0. Furthermore, according to Formula (16), the parameter modification amounts $\Delta vth0$, $\Delta u0$ and $\Delta k2$ are calculated.

As described above, in this embodiment, the gate spacings Ss and Sd are extracted from the layout data 41 and the parameter modification amounts $\Delta vth0$, $\Delta u0$ and $\Delta k2$ are calculated from the extracted gate spacings Ss and Sd according to the model formulas. In the circuit simulation, the transistor model parameters vth0', u0' and k2' modified by using the calculated parameter modification amounts Δvth0, Δu0 and Δk2 are used. This allows performing circuit simulation in consideration with the variations in the transistor characteristics which depend on the gate spacings Ss and Sd.

In particular, the circuit simulation technique in this embodiment allows calculating the parameter variation amount Δvth0 depending on the gate spacings Ss and Sd by using the model formula and modifying the transistor model parameter vth0 based on the parameter variation amount ΔVth0. As a result, accurate circuit simulation in consideration with the effect of the gate spacings Ss and Sd on the threshold voltage of the MOS transistor can be achieved.

It would be apparent that the present invention is not limited to the above embodiments, but may be modified and changed without departing from the scope of the invention. For example, in the above-described embodiments, the model formulas expressing the dependency of the parameter modification amounts vth0, u0, k2 on the gate spacings Ss and Sd are derived and the transistor model parameters vth0, u0 and k2 actually used in circuit simulation are calculated from the parameter modification amounts vth0, u0 and k2. However, model formulas directly calculating the transistor model parameters vth0, u0 and k2 from the gate spacings Ss and Sd may be derived instead. Also in this case, the model formulas are defined so as to include at least one of the following four terms:

(1) a term expressing dependency of the impurity profile in the source/drain region on the gate spacing,
(2) a term expressing dependency of the sidewall width on the gate spacing,
(3) a term expressing dependency of the shadowing at the pocket implantation on the gate spacing, and
(4) a term expressing dependency of the actual gate dimension of the target MOS transistor on the gate spacing. However, in the case where a SPICE simulator, which is the de facto standard of the circuit simulator, is used, the method of describing the parameter modification amounts Δvth0, Δu0 and Δk2 in the modified netlist 42 as in the above-described embodiments is more preferable in terms of implementation.

What is claimed is:

1. A circuit simulation apparatus comprising:
a parameter calculating tool configured to extract a source-side gate spacing and a drain-side gate spacing of a target MOS transistor integrated in an integrated circuit from layout data of said integrated circuit, to calculate from said source-side gate spacing and said drain-side gate spacing, a parameter modification amount which is a modification amount of a transistor model parameter corresponding to a threshold voltage of said target MOS transistor, and to calculate said transistor model parameter corresponding to the threshold voltage of said target MOS transistor by modifying said transistor model parameter in accordance with said parameter modification amount, wherein said source-side gate spacing is a gate spacing between a gate of said target MOS transistor and a gate of a source-side MOS transistor integrated in said integrated circuit and said drain-side gate spacing is a gate spacing between the gate of said target MOS transistor and a gate of a drain-side adjacent MOS transistor integrated in said integrated circuit; and
a circuit simulator configured to perform circuit simulation of said integrated circuit by using said calculated transistor model parameter, the parameter calculating tool and the circuit simulator are realized as a program stored in a non-transitory computer-readable recording medium of the circuit simulation apparatus.

2. The circuit simulation apparatus according to claim 1, wherein said parameter calculating tool calculates said parameter modification amount by using a model formula, and
wherein said model formula includes at least one of the following four terms:
(1) a term for representing a dependency of junction depths in source/drain regions of said target MOS transistor on said source-side gate spacing and said drain-side gate spacing;
(2) a term for representing a dependency of a sidewall width of said target MOS transistor on said source-side gate spacing and said drain-side gate spacing;
(3) a term for representing a dependency of shadowing in pocket implantation on source-side gate spacing and said drain-side gate spacing in a manufacture process of said integrated circuit; and
(4) a term for representing a dependency of an actual gate dimension of said target MOS transistor on said source-side gate spacing and said drain-side gate spacing.

3. The circuit simulation apparatus according to claim 2, wherein said parameter calculating tool configured to calculate a threshold voltage variation amount which is a variation amount from a threshold voltage of a MOS transistor of which source-side and drain-side gate spacings are specific standard values, by using said model formula from said extracted source-side gate spacing and said extracted drain-side gate spacing, to calculate first and second drain current variation amounts from said threshold voltage variation amount, and to calculate said parameter modification amount from said threshold voltage variation amount and said first and second drain current variation amounts,
said first drain current variation amount being a difference from a drain current of a MOS transistor of which gate spacings are said specific standard values in a case where a back bias thereof is 0, and
said second drain current variation amount being a difference from a drain current of a MOS transistor of which source-side and drain-side gate spacings are said specific standard values in a case where a hack bias thereof is a non-zero predetermined value.

4. The circuit simulation apparatus according to claim 3, wherein said parameter calculating tool is configured to calculate said first and second drain current variation amounts so that said first and second drain current variation amounts are linear to said threshold voltage variation amount.

5. The circuit simulation apparatus according to claim 3, wherein said parameter calculating tool is configured to calculate said parameter modification amount so that said parameter modification amount is a linear combination of said first and second drain current variation amounts.

6. The circuit simulation apparatus according to claim 2, wherein said model formula is described with model parameters, and
wherein said model parameters are calculated through data fitting of measured data of characteristics of MOS transistors integrated within a test element group.

7. The circuit simulation apparatus according to claim 2, wherein said model formula includes a term for representing a dependency of an impurity profile in source/drain regions of said target MOS transistor on said source-side gate spacing and said drain-side gate spacing.

8. The circuit simulation apparatus according to claim 2, wherein said model formula includes a term for representing a dependency of a sidewall width of said target MOS transistor on said source-side gate spacing and said drain-side gate spacing.

9. The circuit simulation apparatus according to claim 2, wherein said model formula includes a term for representing a dependency of shadowing in pocket implantation on said source-side gate spacing and said drain-side gate spacing in a manufacture process of said integrated circuit.

10. The circuit simulation apparatus according to claim 2, wherein said model formula includes a term for representing a dependency of an actual gate dimension of said target MOS transistor on said source-side gate spacing and said drain-side gate spacing.

11. The circuit simulation apparatus according to claim 1, wherein said parameter calculating tool calculates said parameter modification amount by using a model formula, and
wherein said model formula includes a term for representing a dependency of a junction depth in source/drain regions of said target MOS transistor on said source-side gate spacing and said drain-side gate spacing.

12. The circuit simulation apparatus according to claim 1, wherein said parameter calculating tool calculates said parameter modification amount by using a model formula, and
wherein said model formula includes a term for representing a dependency of a sidewall width of said target MOS transistor on said source-side gate spacing and said drain-side gate spacing.

13. The circuit simulation apparatus according to claim 1, wherein said parameter calculating tool calculates said parameter modification amount by using a model formula, and
wherein said model formula includes a term for representing a dependency of shadowing in pocket implantation on said source-side gate spacing and said drain-side gate spacing in a manufacture process of said integrated circuit.

14. The circuit simulation apparatus according to claim 1, wherein said parameter calculating tool calculates said parameter modification amount by using a model formula, and
wherein said model formula includes a term for representing a dependency of an actual gate dimension of said target MOS transistor on said source-side gate spacing and said drain-side gate spacing.

15. A circuit simulation method, comprising:
extracting a source-side gate spacing and a drain-side gate spacing of as target MOS transistor integrated in an integrated circuit from layout data of said integrated circuit, wherein said source-side gate spacing is a gate spacing between a gate of said target MOS transistor and a gate of a source-side adjacent MOS transistor integrated in said integrated circuit and said drain-side gate spacing is as gate spacing between the gate of said target MOS transistor and a gate of a drain-side adjacent MOS transistor integrated in said integrated circuit,
calculating from said source-side gate spacing and said drain-side gate spacing a parameter modification amount which is a modification amount of a transistor model parameter corresponding to a threshold voltage of said target MOS transistor;
calculating said transistor model parameter corresponding to the threshold voltage of said target MOS transistor by modifying said transistor model parameter in accordance with said parameter modification amount; and
performing circuit simulation of said integrated circuit by using said calculated transistor model parameter.

16. The circuit simulation method according to claim 15, wherein said parameter modification amount is calculated by using a model formula, and
wherein said model formula includes at least one of the following four terms:
(1) a term for representing a dependency of junction depths in source/drain regions of said target MOS transistor on said source-side gate spacing and said drain-side gate spacing;
(2) a term for representing a dependency of a sidewall width of said target MOS transistor on said source-side gate spacing and said drain-side gate spacing;
(3) a term for representing a dependency of shadowing in pocket implantation on said source-side gate spacing and said drain-side gate spacing in a manufacture process of said integrated circuit; and
(4) a term for representing a dependency of an actual gate dimension of said target MOS transistor on said source-side gate spacing and said drain-side gate spacing.

17. The circuit simulation method according to claim 16, wherein said model formula is described with model parameters, and
wherein said model parameters are calculated through data fitting of measured data of characteristics of MOS transistors integrated within a test element group.

18. The circuit simulation method according to claim 17, wherein said MOS transistors integrated within said test element group include MOS transistors with different gate spacings.

19. A non-transitory recording medium recording a program which when executed causes a computer to perform a circuit simulation method, said method comprising:
extracting a source-side gate spacing and a drain-side gate spacing of a target MOS transistor integrated in an integrated circuit from layout data of said integrated circuit, wherein said source-side gate spacing is a gate spacing between a gate of said target MOS transistor and a gate of a source-side adjacent MOS transistor integrated in said integrated circuit and said drain-side gate spacing is a gate spacing between the gate of said target MOS transistor and a gate of a drain-side adjacent MOS transistor integrated in said integrated circuit,
calculating from said source-side gate spacing and said drain-side gate spacing a parameter modification amount which is a modification amount of a transistor model parameter corresponding to a threshold voltage of said target MOS transistor;
calculating said transistor model parameter corresponding to the threshold voltage of said target MOS transistor by modifying said transistor model parameter in accordance with said parameter modification amount; and
performing circuit simulation of said integrated circuit by using said calculated transistor model parameter.

20. The non-transitory recording medium according to claim 13, wherein said parameter calculating tool calculates said parameter modification amount by using a model formula, and
wherein said model formula includes at least one of the following four terms:
(1) a term for representing a dependency of junction depths in source/drain regions of said target MOS transistor on said source-side gate spacing and said drain-side gate spacing;

(2) a term for representing a dependency of a sidewall width of said target MOS transistor on said source-side gate spacing and said drain-side gate spacing;
(3) a term for representing a dependency of shadowing in pocket implantation on said source-side gate spacing and said drain-side gate spacing in a manufacture process of said integrated circuit; and
(4) a term for representing a dependency of an actual gate dimension of said target MOS transistor on said source-side gate spacing and said drain-side gate spacing.

* * * * *